US010490528B2

United States Patent
Prabhu et al.

(10) Patent No.: US 10,490,528 B2
(45) Date of Patent: Nov. 26, 2019

(54) EMBEDDED WIRE BOND WIRES

(71) Applicant: Invensas Corporation, San Jose, CA (US)

(72) Inventors: Ashok S. Prabhu, San Jose, CA (US); Abiola Awujoola, Pleasanton, CA (US); Wael Zohni, San Jose, CA (US); Willmar Subido, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/993,586

(22) Filed: Jan. 12, 2016

(65) Prior Publication Data

US 2017/0103968 A1    Apr. 13, 2017

Related U.S. Application Data

(60) Provisional application No. 62/240,443, filed on Oct. 12, 2015.

(51) Int. Cl.
*H01L 25/065* (2006.01)
*H01L 23/31* (2006.01)
*H01L 23/00* (2006.01)

(52) U.S. Cl.
CPC ...... *H01L 25/0657* (2013.01); *H01L 23/3135* (2013.01); *H01L 23/3157* (2013.01);
(Continued)

(58) Field of Classification Search
CPC . H01L 33/62; H01L 23/4952; H01L 23/4951; H01L 25/117; H01L 25/0657;
(Continued)

(56) References Cited

U.S. PATENT DOCUMENTS 2,230,663 A    2/1941  Alden
3,289,452 A   12/1966  Koellner
(Continued)

FOREIGN PATENT DOCUMENTS

CN    1352804 A    6/2002
CN    1641832 A    7/2005
(Continued)

OTHER PUBLICATIONS

International Search Report and Written Opinion for PCT Appln. No. PCT/US2016/056526, dated Jan. 20, 2017.
(Continued)

*Primary Examiner* — Allen L Parker
*Assistant Examiner* — Pauline Vu

(57) ABSTRACT

Apparatuses relating generally to a vertically integrated microelectronic package are disclosed. In an apparatus thereof, a substrate has an upper surface and a lower surface opposite the upper surface. A first microelectronic device is coupled to the upper surface of the substrate. The first microelectronic device is a passive microelectronic device. First wire bond wires are coupled to and extend away from the upper surface of the substrate. Second wire bond wires are coupled to and extend away from an upper surface of the first microelectronic device. The second wire bond wires are shorter than the first wire bond wires. A second microelectronic device is coupled to upper ends of the first wire bond wires and the second wire bond wires. The second microelectronic device is located above the first microelectronic device and at least partially overlaps the first microelectronic device.

10 Claims, 17 Drawing Sheets

(52) U.S. Cl.
CPC .............. *H01L 24/01* (2013.01); *H01L 24/42* (2013.01); *H01L 24/44* (2013.01); *H01L 24/46* (2013.01); *H01L 24/47* (2013.01); *H01L 24/48* (2013.01); *H01L 24/49* (2013.01); *H01L 24/45* (2013.01); *H01L 2224/42* (2013.01); *H01L 2224/44* (2013.01); *H01L 2224/45* (2013.01); *H01L 2224/46* (2013.01); *H01L 2224/47* (2013.01); *H01L 2224/48* (2013.01); *H01L 2224/49* (2013.01); *H01L 2224/49051* (2013.01); *H01L 2224/49052* (2013.01); *H01L 2225/06506* (2013.01); *H01L 2225/06537* (2013.01)

(58) Field of Classification Search
CPC ........... H01L 23/5384; H01L 21/76885; H01L 25/043; H01L 25/0756; H01L 23/3157; H01L 23/28; H01L 25/074; H01L 2225/06503; H01L 2225/06506; H01L 24/42–49; H01L 24/01; H01L 2224/42–49; H01L 2224/49051; 2224/49052; H01L 25/0652; H01L 25/071; H01L 25/112; H01L 23/3135; H01L 2224/49105; H01L 23/3107; H01L 23/3114; H01L 2924/181–18161; H01L 21/56–565; H05K 2201/10515
See application file for complete search history.

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,867,267 A | 9/1989 | Carlson |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman et al. |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | DiFrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A * | 2/1999 | Fogal .................. H01L 25/0657 257/723 |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,977,640 A | 11/1999 | Bertin et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |

(56) References Cited

U.S. PATENT DOCUMENTS

| | | | |
|---|---|---|---|
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 * | 5/2001 | Nguyen ............. H01L 21/565 |
| | | | 257/777 |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 * | 6/2002 | Ball ................. H01L 25/50 |
| | | | 257/686 |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,472,743 B2 | 10/2002 | Huang et al. |
| 6,476,503 B1 | 11/2002 | Imamura et al. |
| 6,476,506 B1 * | 11/2002 | O'Connor ......... H01L 23/49838 |
| | | | 257/576 |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,550,666 B2 | 2/2003 | Chew et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,555,918 B2 | 4/2003 | Masuda et al. |
| 6,560,117 B2 | 5/2003 | Moon |
| 6,563,205 B1 * | 5/2003 | Fogal ................ H01L 24/49 |
| | | | 257/686 |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth et al. |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,542 B2 | 5/2004 | Nakatani et al. |
| 6,740,980 B2 * | 5/2004 | Hirose ............... H01L 24/11 |
| | | | 257/686 |
| 6,740,981 B2 | 5/2004 | Hosomi |
| 6,741,085 B1 | 5/2004 | Khandros et al. |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,317 B2 | 8/2004 | Fjelstad |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,780,746 B2 | 8/2004 | Kinsman et al. |
| 6,790,757 B1 | 9/2004 | Chittipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 * | 6/2005 | Cloud .............. H01L 25/0652 |
| | | | 257/686 |
| 6,908,785 B2 | 6/2005 | Kim |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Kamezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |

(56) References Cited

U.S. PATENT DOCUMENTS

| | | |
|---|---|---|
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |
| 7,268,421 B1 | 9/2007 | Lin |
| 7,276,799 B2 | 10/2007 | Lee et al. |
| 7,287,322 B2 | 10/2007 | Mahieu et al. |
| 7,290,448 B2 | 11/2007 | Shirasaka et al. |
| 7,294,920 B2 | 11/2007 | Chen et al. |
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,378,726 B2 | 5/2008 | Punzalan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,485,969 B2 | 2/2009 | Corisis et al. |
| 7,495,179 B2 | 2/2009 | Kubota et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,528,474 B2 | 5/2009 | Lee |
| 7,535,090 B2 | 5/2009 | Furuyama et al. |
| 7,538,565 B1 | 5/2009 | Beaman et al. |
| 7,550,836 B2 | 6/2009 | Chou et al. |
| 7,560,360 B2 | 7/2009 | Cheng et al. |
| 7,564,116 B2 | 7/2009 | Ahn et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,589,394 B2 | 9/2009 | Kawano |
| 7,592,638 B2 | 9/2009 | Kim |
| 7,595,548 B2 | 9/2009 | Shirasaka et al. |
| 7,605,479 B2 | 10/2009 | Mohammed |
| 7,612,638 B2 | 11/2009 | Chung et al. |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,960 B2 | 3/2010 | Wen |
| 7,682,962 B2 | 3/2010 | Hembree |
| 7,683,460 B2 | 3/2010 | Heitzer et al. |
| 7,683,482 B2 | 3/2010 | Nishida et al. |
| 7,692,931 B2 | 4/2010 | Chong et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,800,233 B2 | 9/2010 | Kawano et al. |
| 7,807,512 B2 | 10/2010 | Lee et al. |
| 7,808,093 B2 | 10/2010 | Kagaya et al. |
| 7,808,439 B2 | 10/2010 | Yang et al. |
| 7,815,323 B2 | 10/2010 | Saeki |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,876,180 B2 | 1/2011 | Uchimura |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Seo et al. |
| 7,910,385 B2 | 3/2011 | Kweon et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |

(56) References Cited

U.S. PATENT DOCUMENTS

| | | |
|---|---|---|
| 8,008,121 B2 | 8/2011 | Choi et al. |
| 8,012,797 B2 | 9/2011 | Shen et al. |
| 8,017,437 B2 | 9/2011 | Yoo et al. |
| 8,017,452 B2 | 9/2011 | Ishihara et al. |
| 8,018,033 B2 | 9/2011 | Moriya |
| 8,018,065 B2 | 9/2011 | Lam |
| 8,020,290 B2 | 9/2011 | Sheats |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,106,498 B2 | 1/2012 | Shin et al. |
| 8,115,283 B1 | 2/2012 | Bolognia et al. |
| 8,115,288 B2 | 2/2012 | Bolognia |
| 8,119,516 B2 | 2/2012 | Endo |
| 8,120,054 B2 | 2/2012 | Seo et al. |
| 8,120,186 B2 | 2/2012 | Yoon |
| 8,138,584 B2 | 3/2012 | Wang et al. |
| 8,143,141 B2 | 3/2012 | Sun et al. |
| 8,143,710 B2 | 3/2012 | Cho |
| 8,158,888 B2 | 4/2012 | Shen et al. |
| 8,169,065 B2 | 5/2012 | Kohl et al. |
| 8,174,119 B2 | 5/2012 | Pendse |
| 8,183,682 B2 | 5/2012 | Groenhuis et al. |
| 8,183,684 B2 | 5/2012 | Nakazato |
| 8,193,034 B2 | 6/2012 | Pagaila et al. |
| 8,194,411 B2 | 6/2012 | Leung et al. |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,225,982 B2 | 7/2012 | Pirkle et al. |
| 8,232,141 B2 | 7/2012 | Choi et al. |
| 8,237,257 B2 | 8/2012 | Yang |
| 8,258,010 B2 | 9/2012 | Pagaila et al. |
| 8,258,015 B2 | 9/2012 | Chow et al. |
| 8,263,435 B2 | 9/2012 | Choi et al. |
| 8,264,091 B2 | 9/2012 | Cho et al. |
| 8,269,335 B2 | 9/2012 | Osumi |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,318,539 B2 | 11/2012 | Cho et al. |
| 8,319,338 B1 | 11/2012 | Berry et al. |
| 8,324,633 B2 | 12/2012 | McKenzie et al. |
| 8,330,272 B2 | 12/2012 | Haba |
| 8,349,735 B2 | 1/2013 | Pagaila et al. |
| 8,354,297 B2 | 1/2013 | Pagaila et al. |
| 8,372,741 B1 | 2/2013 | Co et al. |
| 8,390,108 B2 | 3/2013 | Cho et al. |
| 8,390,117 B2 | 3/2013 | Shimizu et al. |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,450,839 B2 | 5/2013 | Corisis et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,492,201 B2 | 7/2013 | Pagaila et al. |
| 8,502,387 B2 | 8/2013 | Choi et al. |
| 8,507,297 B2 | 8/2013 | Iida et al. |
| 8,518,746 B2 | 8/2013 | Pagaila et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,567,051 B2 | 10/2013 | Val |
| 8,569,892 B2 | 10/2013 | Mori et al. |
| 8,580,607 B2 | 11/2013 | Haba |
| 8,598,717 B2 | 12/2013 | Masuda |
| 8,618,646 B2 | 12/2013 | Sasaki et al. |
| 8,618,659 B2 | 12/2013 | Sato et al. |
| 8,624,374 B2 | 1/2014 | Ding et al. |
| 8,633,059 B2 | 1/2014 | Do et al. |
| 8,637,991 B2 | 1/2014 | Haba |
| 8,642,393 B1 | 2/2014 | Yu et al. |
| 8,646,508 B2 | 2/2014 | Kawada |
| 8,653,668 B2 | 2/2014 | Uno et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,670,261 B2 | 3/2014 | Crisp et al. |
| 8,680,662 B2 | 3/2014 | Haba et al. |
| 8,680,677 B2 | 3/2014 | Wyland |
| 8,680,684 B2 | 3/2014 | Haba et al. |
| 8,685,792 B2 | 4/2014 | Chow et al. |
| 8,686,570 B2 | 4/2014 | Semmelmeyer et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,766,436 B2 | 7/2014 | Delucca et al. |
| 8,772,152 B2 | 7/2014 | Co et al. |
| 8,772,817 B2 | 7/2014 | Yao |
| 8,785,245 B2 | 7/2014 | Kim |
| 8,791,575 B2 | 7/2014 | Oganesian et al. |
| 8,796,135 B2 | 8/2014 | Oganesian et al. |
| 8,796,846 B2 | 8/2014 | Lin et al. |
| 8,802,494 B2 | 8/2014 | Lee et al. |
| 8,810,031 B2 | 8/2014 | Chang et al. |
| 8,816,404 B2 | 8/2014 | Kim et al. |
| 8,816,505 B2 | 8/2014 | Mohammed et al. |
| 8,835,228 B2 | 9/2014 | Mohammed |
| 8,836,136 B2 | 9/2014 | Chau et al. |
| 8,836,140 B2 | 9/2014 | Ma et al. |
| 8,836,147 B2 | 9/2014 | Uno et al. |
| 8,841,765 B2 | 9/2014 | Haba et al. |
| 8,846,521 B2 | 9/2014 | Sugizaki |
| 8,847,376 B2 | 9/2014 | Oganesian et al. |
| 8,853,558 B2 | 10/2014 | Gupta et al. |
| 8,878,353 B2 | 11/2014 | Haba et al. |
| 8,884,416 B2 | 11/2014 | Lee et al. |
| 8,893,380 B2 | 11/2014 | Kim et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |

(56) References Cited

U.S. PATENT DOCUMENTS

| | | | |
|---|---|---|---|
| 8,946,757 B2 | 2/2015 | Mohammed et al. |
| 8,948,712 B2 | 2/2015 | Chen et al. |
| 8,963,339 B2 | 2/2015 | He et al. |
| 8,970,049 B2 | 3/2015 | Kamezos |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,123,664 B2 | 9/2015 | Haba |
| 9,128,123 B2 | 9/2015 | Liu et al. |
| 9,136,254 B2 | 9/2015 | Zhao et al. |
| 9,142,586 B2 | 9/2015 | Wang et al. |
| 9,153,562 B2 | 10/2015 | Haba et al. |
| 9,167,710 B2 | 10/2015 | Mohammed et al. |
| 9,171,790 B2 | 10/2015 | Yu et al. |
| 9,177,832 B2 | 11/2015 | Camacho |
| 9,196,586 B2 | 11/2015 | Chen et al. |
| 9,196,588 B2 | 11/2015 | Leal |
| 9,209,081 B2 | 12/2015 | Lim et al. |
| 9,214,434 B1 | 12/2015 | Kim et al. |
| 9,224,647 B2 | 12/2015 | Koo et al. |
| 9,224,717 B2 | 12/2015 | Sato et al. |
| 9,258,922 B2 | 2/2016 | Chen et al. |
| 9,263,394 B2 | 2/2016 | Uzoh et al. |
| 9,263,413 B2 | 2/2016 | Mohammed |
| 9,299,670 B2 | 3/2016 | Yap et al. |
| 9,318,449 B2 | 4/2016 | Hasch et al. |
| 9,318,452 B2 | 4/2016 | Chen et al. |
| 9,324,696 B2 | 4/2016 | Choi et al. |
| 9,330,945 B2 | 5/2016 | Song et al. |
| 9,349,706 B2 | 5/2016 | Co et al. |
| 9,362,161 B2 | 6/2016 | Chi et al. |
| 9,378,982 B2 | 6/2016 | Lin et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,405,064 B2 | 8/2016 | Herbsommer et al. |
| 9,412,661 B2 | 8/2016 | Lu et al. |
| 9,418,940 B2 | 8/2016 | Hoshino et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |
| 9,508,622 B2 | 11/2016 | Higgins |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 2001/0020545 A1* | 9/2001 | Eldridge ............ B23K 20/004 174/260 |
| 2001/0042925 A1 | 11/2001 | Yamamoto et al. |
| 2002/0011654 A1* | 1/2002 | Kimura ................ H01L 24/06 257/686 |
| 2002/0014004 A1 | 2/2002 | Beaman et al. |
| 2002/0079568 A1 | 6/2002 | Degani et al. |
| 2002/0125556 A1 | 9/2002 | Oh et al. |
| 2002/0171152 A1 | 11/2002 | Miyazaki |
| 2003/0006494 A1 | 1/2003 | Lee et al. |
| 2003/0042621 A1* | 3/2003 | Chen ................ H01L 23/3128 257/784 |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0137042 A1* | 7/2003 | Mess ................ H01L 24/49 257/686 |
| 2003/0162378 A1 | 8/2003 | Mikami |
| 2004/0041757 A1 | 3/2004 | Yang et al. |
| 2004/0262728 A1 | 12/2004 | Sterrett et al. |
| 2005/0017369 A1 | 1/2005 | Clayton et al. |
| 2005/0052830 A1* | 3/2005 | Bauer ................ H01L 24/97 361/679.02 |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0161814 A1 | 7/2005 | Mizukoshi et al. |
| 2005/0173807 A1 | 8/2005 | Zhu et al. |
| 2005/0176233 A1 | 8/2005 | Joshi et al. |
| 2006/0084253 A1* | 4/2006 | Mizukoshi .......... H01L 21/4846 438/584 |
| 2006/0087013 A1* | 4/2006 | Hsieh .................. H01L 25/0652 257/678 |
| 2006/0138624 A1* | 6/2006 | Kwon ................ H01L 25/0657 257/678 |
| 2006/0216868 A1 | 9/2006 | Yang et al. |
| 2006/0220206 A1* | 10/2006 | Gerber .............. H01L 23/49816 257/686 |
| 2006/0255449 A1 | 11/2006 | Lee et al. |
| 2007/0010086 A1 | 1/2007 | Hsieh |
| 2007/0080360 A1 | 4/2007 | Mirsky et al. |
| 2007/0164457 A1 | 7/2007 | Yamaguchi et al. |
| 2007/0181989 A1* | 8/2007 | Corisis ................ H01L 21/561 257/686 |
| 2007/0190747 A1 | 8/2007 | Hup |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0036082 A1* | 2/2008 | Eun ................ H01L 21/76898 257/737 |
| 2008/0042265 A1* | 2/2008 | Merilo ................ H01L 24/49 257/723 |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |

(56) References Cited

U.S. PATENT DOCUMENTS

| | | | |
|---|---|---|---|
| 2008/0123310 A1 | 5/2008 | Beaman et al. | |
| 2008/0129319 A1 | 6/2008 | Beaman et al. | |
| 2008/0129320 A1 | 6/2008 | Beaman et al. | |
| 2008/0132094 A1 | 6/2008 | Beaman et al. | |
| 2008/0150093 A1 | 6/2008 | Jang et al. | |
| 2008/0156518 A1 | 7/2008 | Honer et al. | |
| 2008/0157325 A1* | 7/2008 | Chow | H01L 23/3128 257/686 |
| 2008/0164595 A1 | 7/2008 | Wu et al. | |
| 2008/0169548 A1 | 7/2008 | Baek | |
| 2008/0217708 A1* | 9/2008 | Reisner | H01L 23/3121 257/416 |
| 2008/0246126 A1* | 10/2008 | Bowles | H01L 23/3114 257/659 |
| 2008/0254571 A1* | 10/2008 | Corisis | H01L 25/0657 438/109 |
| 2008/0280393 A1 | 11/2008 | Lee et al. | |
| 2008/0284045 A1 | 11/2008 | Gerber et al. | |
| 2008/0073756 A1 | 12/2008 | Heitzer | |
| 2008/0303124 A1* | 12/2008 | Khan | H01L 23/3128 257/675 |
| 2008/0303153 A1 | 12/2008 | Oi et al. | |
| 2008/0308305 A1 | 12/2008 | Kawabe | |
| 2009/0008796 A1 | 1/2009 | Eng et al. | |
| 2009/0014876 A1 | 1/2009 | Youn et al. | |
| 2009/0032913 A1 | 2/2009 | Haba | |
| 2009/0057918 A1* | 3/2009 | Kim | H01L 25/0657 257/777 |
| 2009/0085185 A1 | 4/2009 | Byun et al. | |
| 2009/0091009 A1 | 4/2009 | Corisis et al. | |
| 2009/0102063 A1 | 4/2009 | Lee et al. | |
| 2009/0127686 A1 | 5/2009 | Yang et al. | |
| 2009/0128176 A1 | 5/2009 | Beaman et al. | |
| 2009/0140415 A1 | 6/2009 | Furuta | |
| 2009/0152700 A1* | 6/2009 | Kuan | H01L 23/3128 257/686 |
| 2009/0152706 A1* | 6/2009 | Kuan | H01L 21/565 257/690 |
| 2009/0155960 A1* | 6/2009 | Chow | H01L 23/3185 438/127 |
| 2009/0166664 A1 | 7/2009 | Park et al. | |
| 2009/0166873 A1 | 7/2009 | Yang et al. | |
| 2009/0189288 A1 | 7/2009 | Beaman et al. | |
| 2009/0194829 A1* | 8/2009 | Chung | B81C 1/0023 257/415 |
| 2009/0256229 A1 | 10/2009 | Ishikawa et al. | |
| 2009/0315579 A1 | 12/2009 | Beaman et al. | |
| 2010/0032822 A1 | 2/2010 | Liao et al. | |
| 2010/0044860 A1 | 2/2010 | Haba et al. | |
| 2010/0078795 A1 | 4/2010 | Dekker et al. | |
| 2010/0087035 A1* | 4/2010 | Yoo | H01L 25/16 438/109 |
| 2010/0193937 A1 | 8/2010 | Nagamatsu et al. | |
| 2010/0200981 A1 | 8/2010 | Huang et al. | |
| 2010/0258955 A1 | 10/2010 | Miyagawa et al. | |
| 2010/0289142 A1 | 11/2010 | Shim et al. | |
| 2010/0314748 A1 | 12/2010 | Hsu et al. | |
| 2010/0327419 A1 | 12/2010 | Muthukumar et al. | |
| 2011/0042699 A1 | 2/2011 | Park et al. | |
| 2011/0049728 A1* | 3/2011 | Pagani | H01L 22/32 257/773 |
| 2011/0068478 A1 | 3/2011 | Pagaila et al. | |
| 2011/0157834 A1 | 6/2011 | Wang | |
| 2011/0209908 A1 | 9/2011 | Lin et al. | |
| 2011/0215451 A1* | 9/2011 | Yim | H01L 24/73 257/666 |
| 2011/0215472 A1 | 9/2011 | Chandrasekaran | |
| 2012/0001336 A1 | 1/2012 | Zeng et al. | |
| 2012/0043655 A1 | 2/2012 | Khor et al. | |
| 2012/0063090 A1 | 3/2012 | Hsiao et al. | |
| 2012/0080787 A1 | 4/2012 | Shah et al. | |
| 2012/0086111 A1 | 4/2012 | Iwamoto et al. | |
| 2012/0126431 A1 | 5/2012 | Kim et al. | |
| 2012/0153444 A1 | 6/2012 | Haga et al. | |
| 2012/0184116 A1 | 7/2012 | Pawlikowski et al. | |
| 2012/0223429 A1 | 9/2012 | Khan et al. | |
| 2012/0280386 A1* | 11/2012 | Sato | H01L 23/3121 257/737 |
| 2012/0306061 A1 | 12/2012 | Tabatabai | |
| 2012/0313239 A1* | 12/2012 | Zohni | H01L 24/81 257/737 |
| 2013/0001797 A1 | 1/2013 | Choi et al. | |
| 2013/0040423 A1 | 2/2013 | Tung | |
| 2013/0049218 A1 | 2/2013 | Gong et al. | |
| 2013/0070507 A1* | 3/2013 | Yoon | G11C 7/1084 365/51 |
| 2013/0087915 A1 | 4/2013 | Warren et al. | |
| 2013/0093087 A1* | 4/2013 | Chau | H01L 23/49517 257/738 |
| 2013/0093088 A1* | 4/2013 | Chau | H01L 23/49517 257/738 |
| 2013/0153646 A1 | 6/2013 | Ho | |
| 2013/0168842 A1* | 7/2013 | Park | H01L 24/48 257/690 |
| 2013/0200524 A1 | 8/2013 | Han et al. | |
| 2013/0234317 A1 | 9/2013 | Chen et al. | |
| 2013/0256847 A1 | 10/2013 | Park et al. | |
| 2013/0323409 A1 | 12/2013 | Read et al. | |
| 2013/0328178 A1 | 12/2013 | Bakalski et al. | |
| 2014/0021583 A1 | 1/2014 | Lo et al. | |
| 2014/0035892 A1 | 2/2014 | Shenoy et al. | |
| 2014/0103527 A1 | 4/2014 | Marimuthu et al. | |
| 2014/0124949 A1 | 5/2014 | Paek et al. | |
| 2014/0175657 A1 | 6/2014 | Oka et al. | |
| 2014/0225248 A1* | 8/2014 | Henderson | H01L 21/50 257/712 |
| 2014/0239479 A1 | 8/2014 | Start | |
| 2014/0239490 A1 | 8/2014 | Wang | |
| 2014/0308907 A1 | 10/2014 | Chen | |
| 2014/0312503 A1 | 10/2014 | Seo | |
| 2015/0044823 A1 | 2/2015 | Mohammed | |
| 2015/0076714 A1* | 3/2015 | Haba | H01L 21/4846 257/784 |
| 2015/0130054 A1 | 5/2015 | Lee et al. | |
| 2015/0145116 A1* | 5/2015 | Uzoh | H01L 24/10 257/712 |
| 2015/0206865 A1 | 7/2015 | Yu et al. | |
| 2015/0340305 A1 | 11/2015 | Lo | |
| 2015/0380376 A1 | 12/2015 | Mathew et al. | |
| 2016/0043813 A1 | 2/2016 | Chen et al. | |
| 2016/0172268 A1* | 6/2016 | Katkar | H01L 21/76885 257/774 |
| 2016/0200566 A1 | 7/2016 | Ofner et al. | |
| 2016/0225692 A1 | 8/2016 | Kim et al. | |
| 2017/0117231 A1 | 4/2017 | Awujoola et al. | |
| 2017/0229432 A1 | 10/2017 | Lin et al. | |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 A | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | 1118364 | 5/1989 |
| JP | H04-346436 A | 12/1992 |
| JP | 06268015 A | 9/1994 |
| JP | H06268101 A | 9/1994 |
| JP | H06333931 A | 12/1994 |
| JP | 07-122787 A | 5/1995 |

(56) References Cited

FOREIGN PATENT DOCUMENTS

| | | |
|---|---|---|
| JP | 09505439 | 5/1997 |
| JP | H1065054 A | 3/1998 |
| JP | H10135220 A | 5/1998 |
| JP | H10135221 A | 5/1998 |
| JP | 11-074295 A | 3/1999 |
| JP | 11135663 A | 5/1999 |
| JP | H11-145323 A | 5/1999 |
| JP | 11251350 A | 9/1999 |
| JP | H11260856 A | 9/1999 |
| JP | 11317476 | 11/1999 |
| JP | 2000156461 A | 6/2000 |
| JP | 2000323516 A | 11/2000 |
| JP | 3157134 B2 | 4/2001 |
| JP | 2001196407 A | 7/2001 |
| JP | 2001326236 A | 11/2001 |
| JP | 2002050871 A | 2/2002 |
| JP | 2002289769 A | 10/2002 |
| JP | 2003122611 A | 4/2003 |
| JP | 2003-174124 A | 6/2003 |
| JP | 2003197668 A | 7/2003 |
| JP | 2003307897 A | 10/2003 |
| JP | 2003318327 A | 11/2003 |
| JP | 2004031754 A | 1/2004 |
| JP | 2004047702 A | 2/2004 |
| JP | 2004048048 A | 2/2004 |
| JP | 2004-172157 A | 6/2004 |
| JP | 2004-200316 A | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005093551 A | 4/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007194436 A | 8/2007 |
| JP | 2007234845 A | 9/2007 |
| JP | 2007287922 A | 11/2007 |
| JP | 2007-335464 A | 12/2007 |
| JP | 200834534 A | 2/2008 |
| JP | 2008166439 A | 7/2008 |
| JP | 2008171938 A | 7/2008 |
| JP | 2008235378 A | 10/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 A | 2/2009 |
| JP | 2009508324 A | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 A1 | 9/2000 |
| KR | 20010061849 A | 7/2001 |
| KR | 2001-0094894 A | 11/2001 |
| KR | 20020058216 A | 7/2002 |
| KR | 20060064291 A | 6/2006 |
| KR | 10-2007-0058680 A | 6/2007 |
| KR | 20080020069 | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 10-2010-0050750 | 5/2010 |
| KR | 20100062315 A | 6/2010 |
| KR | 101011863 B1 | 1/2011 |
| KR | 20120075855 A | 7/2012 |
| KR | 101215271 B1 | 12/2012 |
| KR | 20130048810 A | 5/2013 |
| KR | 20150012285 A | 2/2015 |
| TW | 200539406 A | 12/2005 |
| TW | 200721327 A | 6/2007 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| TW | I605558 B | 11/2017 |
| WO | 9615458 A1 | 5/1996 |
| WO | 02-13256 A1 | 2/2002 |
| WO | 03-045123 A1 | 5/2003 |
| WO | 2004077525 A2 | 9/2004 |
| WO | 2006050691 A2 | 5/2006 |
| WO | 2007101251 A2 | 9/2007 |
| WO | 2007116544 A1 | 10/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

U.S. Appl. No. 13/477,532, mailed May 22, 2012.
U.S. Office Action for U.S. Appl. No. 12/769,930, dated May 5, 2011.
3D Plus "Wafer Level Stack—WDoD", [online] [Retrieved Aug. 5, 2010] Retrieved from internet: <http://www.3d-plus.com/techno-wafer-level-stack-wdod.php>, 2 pages.
Nritten Opinion for Appln. No. PCT/US2014/050125, dated Jul. 15, 2015.
Yoon, PhD, Seung Wook, "Next Generation Wafer Level Packaging Solution for 3D Integration," May 2010, STATS ChipPAC Ltd.
International Search Report and Written Opinion for Appln. No. PCT/US2013/041981, dated Nov. 13, 2013.
International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.

(56) References Cited

OTHER PUBLICATIONS

International Preliminary Report on Patentability for Appln. No. PCT/US2014/055695, dated Dec. 15, 2015.
International Search Report and Written Opinion for Appln. No. PCT/US2016/056402, dated Jan. 31, 2017.
Japanese Office Action for Appln. No. 2013-509325, dated Oct. 18, 2013.
Japanese Office Action for Appln. No. 2013-520776, dated Apr. 21, 2015.
Japanese Office Action for Appln. No. 2013-520777, dated May 22, 2015.
Jin, Yonggang et al., "STM 3D-IC Package and 3D eWLB Development," STMicroelectronics Singapore/STMicroelectronics France, May 21, 2010, 28 pages.
Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.
Korean Search Report KR10-2011-0041843, dated Feb. 24, 2011.
Meiser, S., "Klein Und Komplex," Elektronik Irl Press Ltd, DE, vol. 41, No. 1, Jan. 7, 1992 (Jan. 7, 1992) pp. 72-77, XP000277326, [ISR Appln. No. PCT/US2012/060402, dated Feb. 21, 2013 provides concise stmt. Of relevance).
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003, 34 pages.
North Corporation, Processed intra-Layer Interconnection Material for PWBs [Etched Copper Bump with Copper Foil], NMBITM, Version 2001.6.
NTK HTCC Package General Design Guide, Communication Media Components Group, NGK Spark Plug Co., Ltd., Komaki, Aichi, Japan, Apr. 2010, 32 pages.
Partial International Search Report from Invitation to Pay Additional Fees for Appln. No. PCT/US2012/028738, dated Jun. 6, 2012.
Partial International Search Report for Appln. No. PCT/US2012/060402, dated Feb. 21, 2013.
Partial International Search Report for Appln. No. PCT/US2013/026126, dated Jun. 17, 2013.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/033004, dated Sep. 9, 2015.
Redistributed Chip Package (RCP) Technology, Freescale Semiconductor, 2005, 6 pages.
Taiwan Office Action for 102106326, dated Dec. 13, 2013.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Taiwan Office Action for 103103350, dated Mar. 21, 2016.
Bang, U.S. Appl. No. 10/656,534, filed Sep. 5, 2003.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.
Chinese Office Action for Application No. 201180022247.8 dated Sep. 16, 2014.
Chinese Office Action for Application No. 201180022247.8 dated Apr. 14, 2015.
Chinese Office Action for Application No. 201310264264.3 dated May 12, 2015.
EE Times Asia "Freescale Cuts Die Area, Thickness with New Packaging Tech" [online] [Retrieved Aug. 5, 2010] Retrieved from internet: <http://www.eetasia.com/ART_8800428222_280300_NT_DEC52276.htm>, Aug. 3, 2006, 2 pages.
Extended European Search Report for Appln. No. EP13162975, dated Sep. 5, 2013.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Appln. No. PCT/US2005/039716, dated Apr. 5, 2006.
International Search Report and Written Opinion for Appln. No. PCT/US2011/024143, dated Sep. 14, 2011.
Partial Search Report—Invitation to Pay Fees for Appln. No. PCT/US2011/024143, dated Jan. 17, 2012.
International Search Report and Written Opinion for Appln. No. PCT/US2011/060551, dated Apr. 18, 2012.
International Search Report and Written Opinion for Appln. No. PCT/US2011/044342, dated May 7, 2012.
International Search Report and Written Opinion for Appln. No. PCT/US2011/044346, dated May 11, 2012.
International Search Report and Written Opinion for Appln. No. PCT/US2012/060402, dated Apr. 2, 2013.
International Search Report and Written Opinion for Appln. No. PCT/US2013/026126, dated Jul. 25, 2013.
International Search Report and Written Opinion for Appln. No. PCT/US2013/052883, dated Oct. 21, 2013.
International Search Report and Written Opinion for Appln. No. PCT/US2017/064437, dated Mar. 29, 2018.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
International Search Report and Written Opinion for Appln. No. PCT/US2015/032679, dated Nov. 11, 2015.
International Search Report and Written Opinion for Appln. No. PCT/US2016/068297, dated Apr. 17, 2017.
Taiwan Search Report for 105128420, dated Sep. 26, 2017.
Chinese Office Action Search Report for Application No. 2014800551784 dated Jan. 23, 2018.
European Search Report for Appln. No. EP12712792, dated Feb. 27, 2018, 2 pages.

* cited by examiner

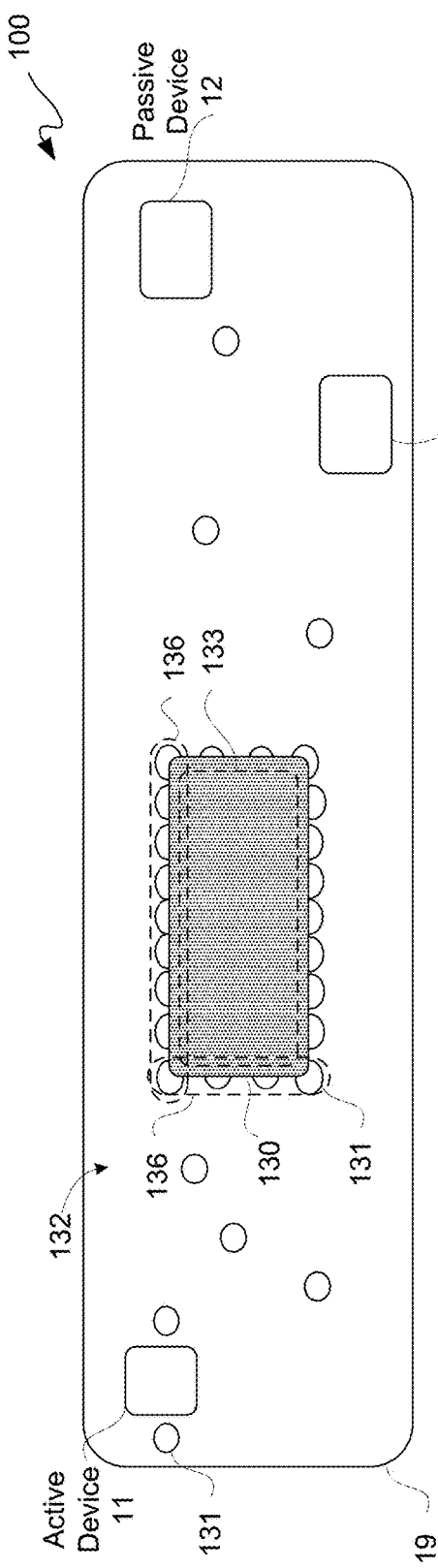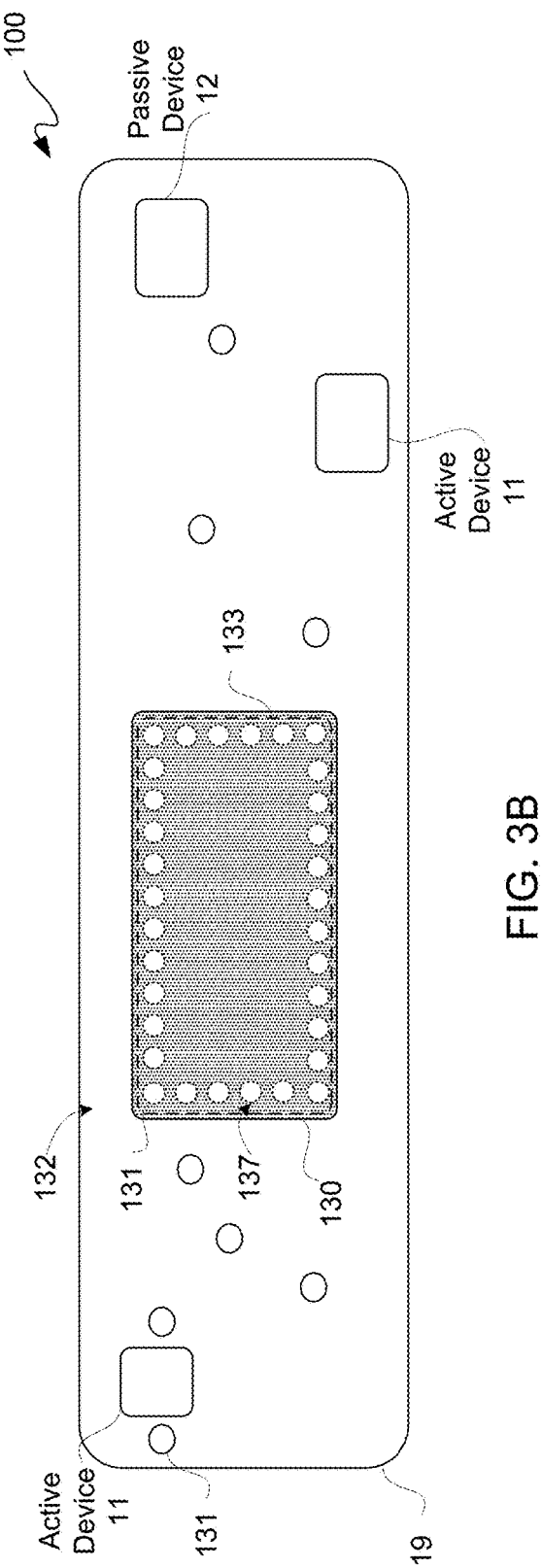
FIG. 3A
FIG. 3B

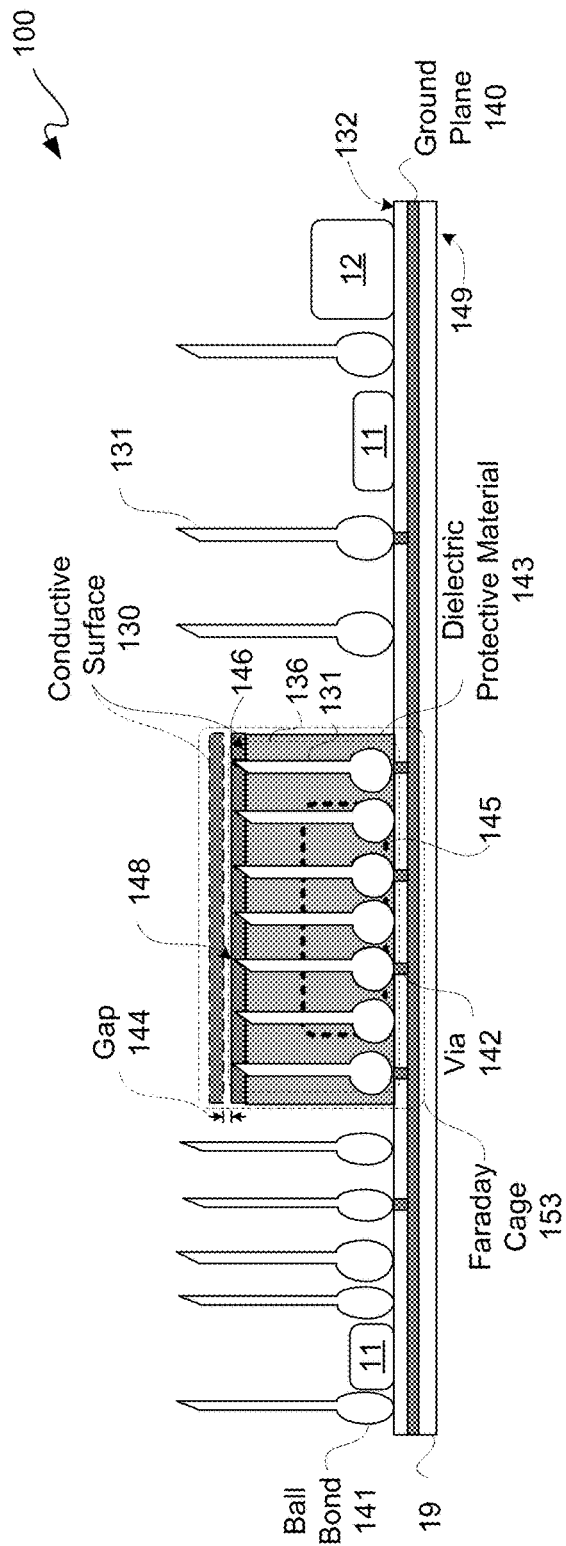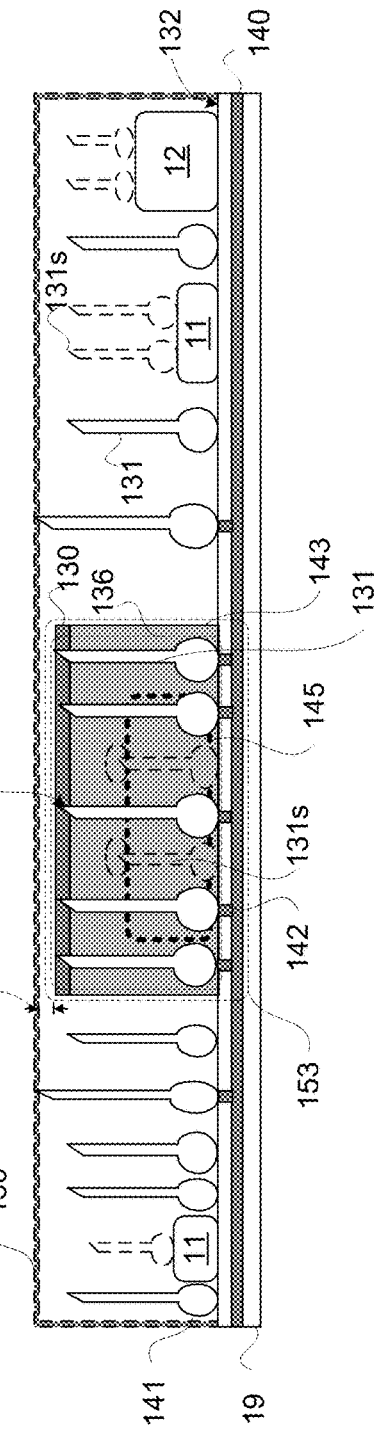
FIG. 4
FIG. 5

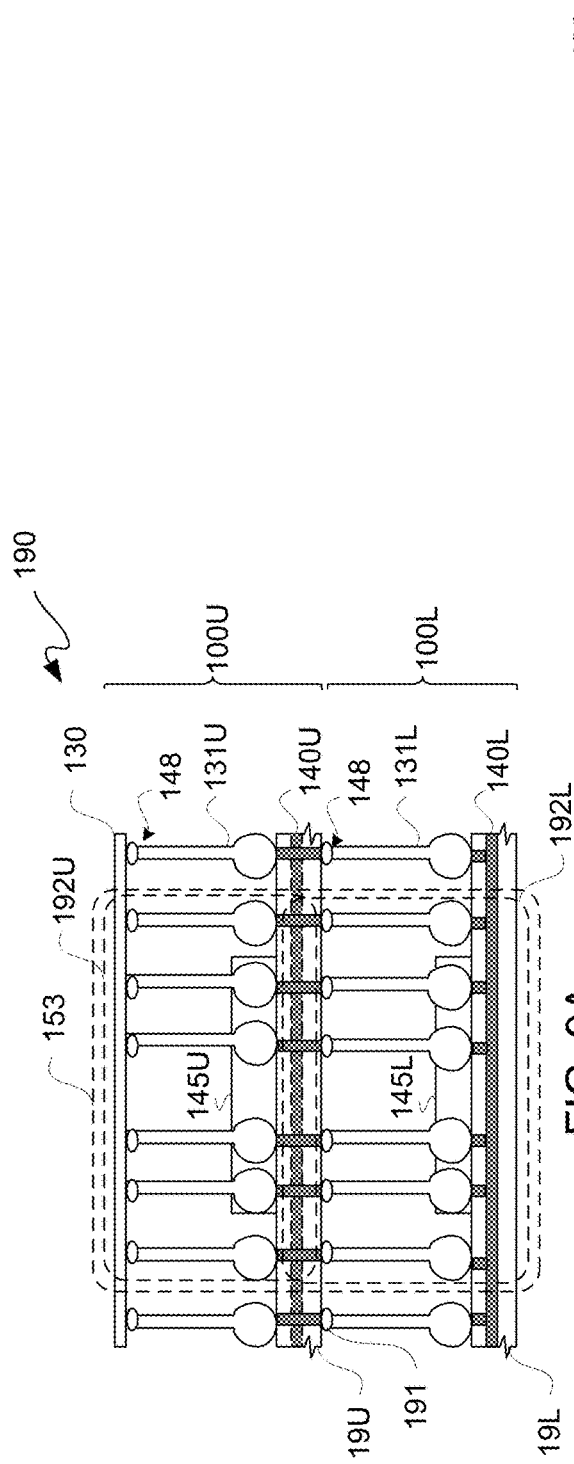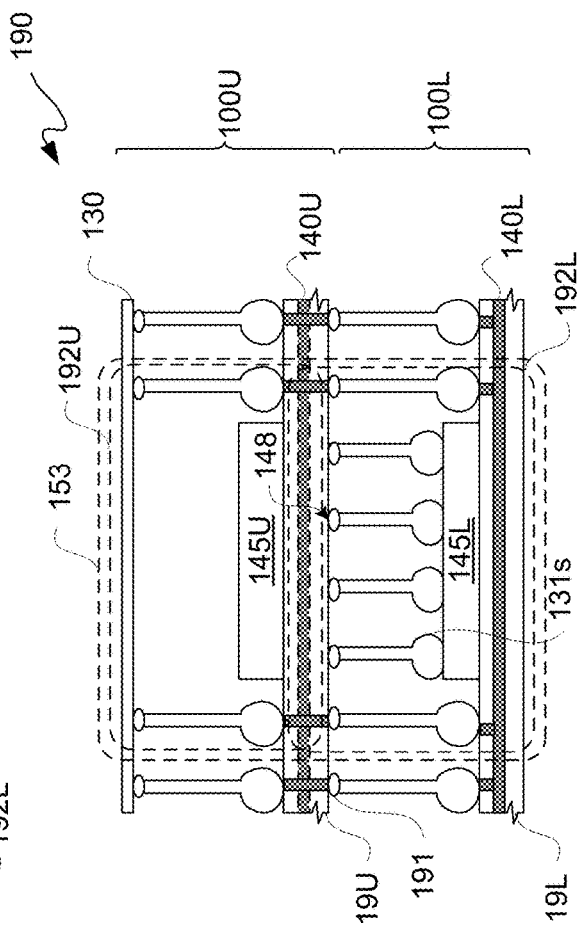

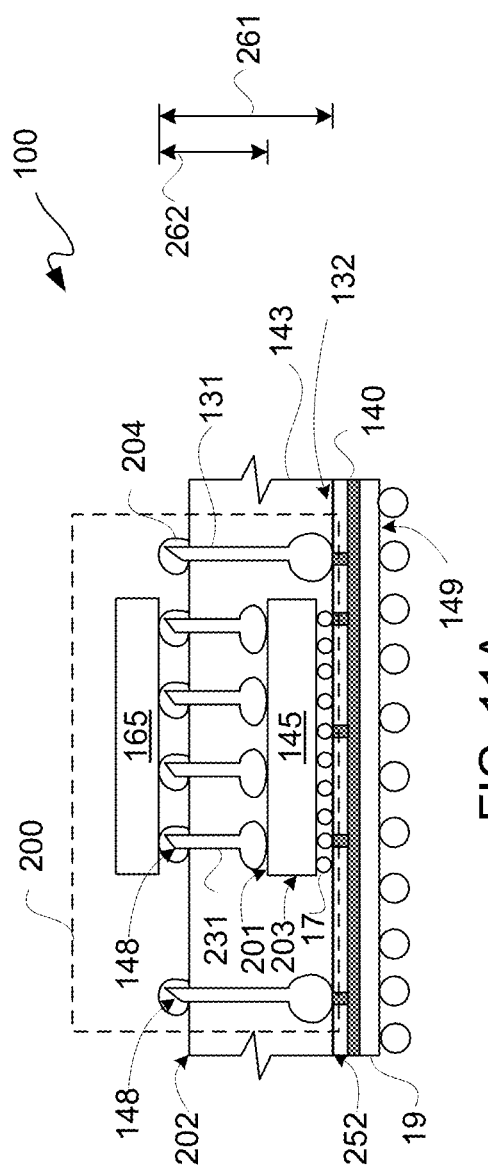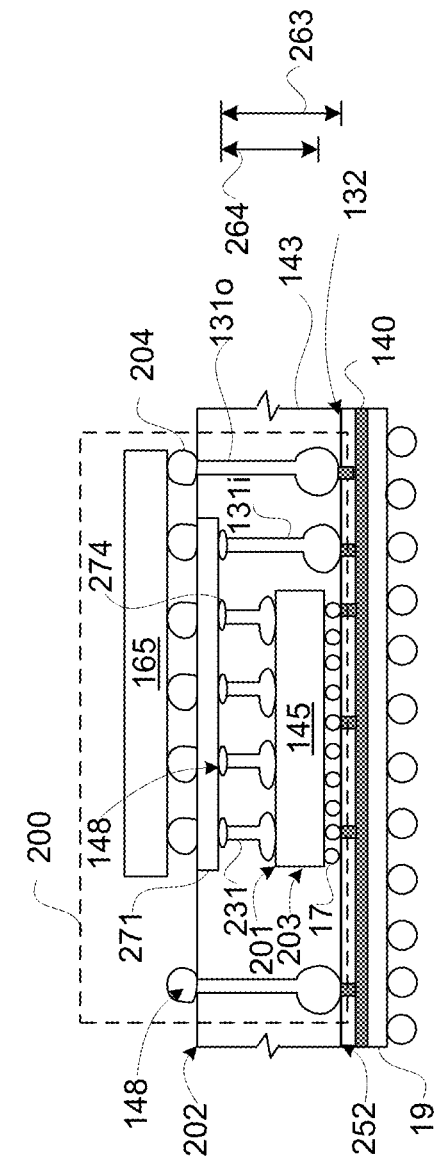
FIG. 11A
FIG. 11B

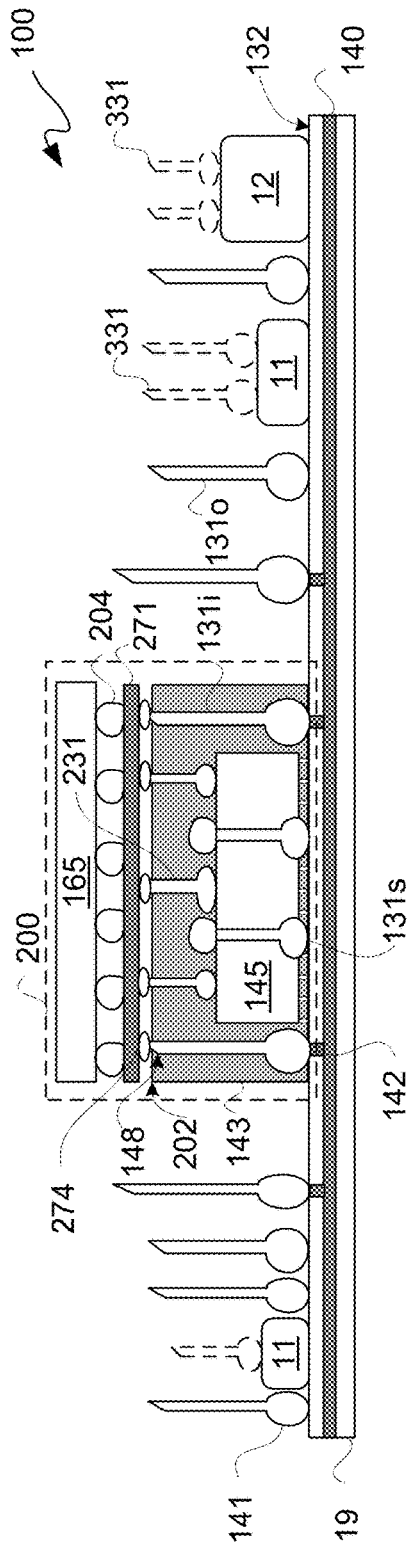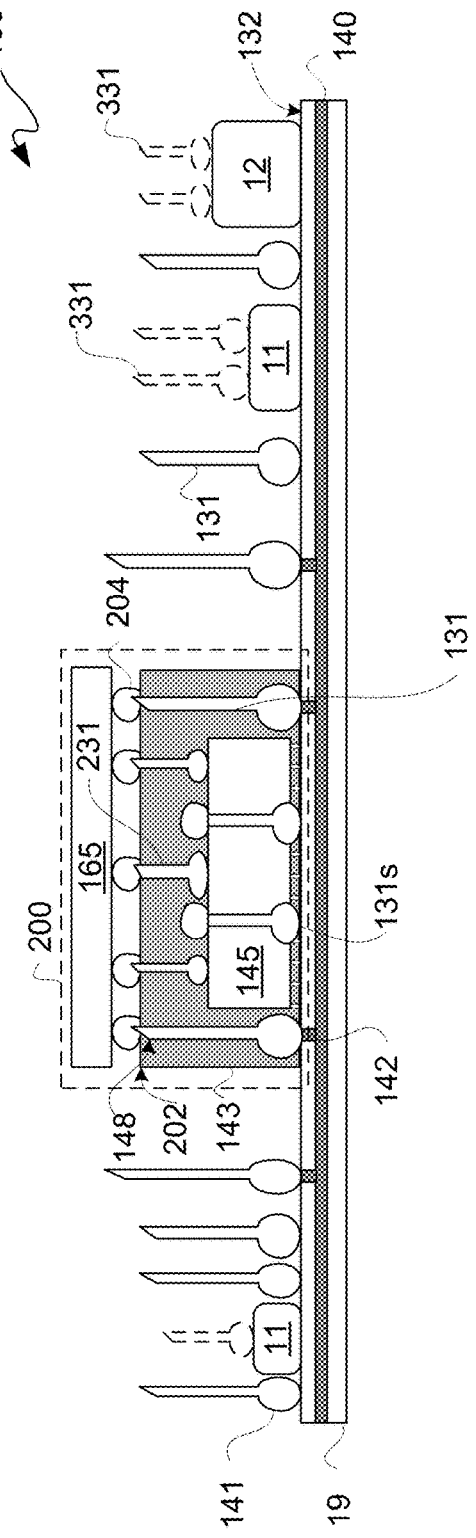
FIG. 13A
FIG. 13B

EMBEDDED WIRE BOND WIRES

CROSS-REFERENCE TO RELATED APPLICATION(S)

This application hereby claims priority to U.S. provisional patent application Ser. No. U.S. 62/240,443, filed on Oct. 12, 2015, the entirety of which is hereby incorporated by reference herein for all purposes.

FIELD

The following description relates generally to embedded wire bond wires. More particularly, the following description relates to embedded wire bond wires interconnected to various surfaces of a package for vertical integration for multi-level interconnections.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be a passive or an active IC, where the latter includes one or more active devices, such as transistors for example, and the former does not include any active device but may include one or more passive devices, such as capacitors, inductors, and/or resistors. Furthermore, an interposer may be formed like a PWB, namely without any circuit elements, such as without any passive or active devices. Additionally, an interposer may include at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC; or an IC may be coupled to a circuit platform by soldering. Additionally, a redistribution layer ("RDL") may be part of an IC to facilitate a flip-chip configuration, die stacking, or more convenient or accessible position of bond pads for example.

Some passive or active microelectronic devices may be used in a System-in-Package ("SiP") or other multi-die/component package. However, some SiPs may take up too much area for some applications. Moreover, for some low-profile applications, some SiPs may be used; however, forming a SiP for stacking using through substrate vias may be too expensive for some applications.

Accordingly, it would be desirable and useful to provide vertical integration for a SiP.

BRIEF SUMMARY

An apparatus relates generally to a vertically integrated microelectronic package. In such an apparatus, a substrate has an upper surface and a lower surface opposite the upper surface. A first microelectronic device is coupled to the upper surface of the substrate. The first microelectronic device may be an active or passive microelectronic device. First wire bond wires are coupled to and extend away from the upper surface of the substrate. Second wire bond wires are coupled to and extend away from an upper surface of the first microelectronic device. The second wire bond wires are shorter than the first wire bond wires. A second microelectronic device is coupled to upper ends of the first wire bond wires and the second wire bond wires. The second microelectronic device is located above the first microelectronic device and at least partially overlaps the first microelectronic device.

An apparatus relates generally to another vertically integrated microelectronic package. In such an apparatus, a substrate has an upper surface and a lower surface opposite the upper surface. A first microelectronic device is coupled to the upper surface of the substrate. The first microelectronic device is an active or passive microelectronic device. First wire bond wires are coupled to and extend away from the upper surface of the substrate. Second wire bond wires are coupled to and extend away from an upper surface of the first microelectronic device. A first portion of the first wire bond wires are taller than the second wire bond wires. A second microelectronic device is coupled to first upper ends of the first portion the first wire bond wires and is coupled to upper ends of the second wire bond wires. The second microelectronic device located above the first microelectronic device and at least partially overlapping the first microelectronic device. A second portion of the first wire bond wires having second upper ends thereof coupled to the upper surface of the first microelectronic device.

An apparatus relates generally to yet another vertically integrated microelectronic package. In this apparatus, a first circuit platform has an upper surface and a lower surface opposite the upper surface. A microelectronic device is coupled to the upper surface of the first circuit platform. First wire bond wires are coupled to and extend away from the upper surface of the first circuit platform. Second wire bond wires are coupled to and extend away from an upper surface of the microelectronic device. The second wire bond wires are shorter than the first wire bond wires. A second circuit platform is coupled to upper ends of the first wire bond wires and the second wire bond wires. The second circuit platform is located above the first microelectronic device and at least partially overlaps the first microelectronic device.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 3A and 3B are top views of block diagrams depicting respective exemplary SiPs with EMI shielding.

FIG. 4 is a block diagram of a cross-sectional side view depicting an exemplary SiP with EMI shielding.

FIG. 5 is a block diagram of a cross-sectional side view depicting an exemplary SiP with a conductive cover and with signal wire bond wires in an EMI shielding region under the conductive cover.

FIG. 9A is a block diagram of a cross-sectional side view depicting an exemplary portion of a package-on-package ("PoP") device with EMI shielding.

FIG. 9B is a block diagram of a cross-sectional side view depicting an exemplary portion of another PoP device with EMI shielding.

FIG. 11A is a block diagram of a cross-sectional side view depicting an exemplary portion of a SiP without wire bond wire EMI shielding.

FIG. 11B is a block diagram of a cross-sectional side view depicting an exemplary portion of another SiP without wire bond wire EMI shielding.

FIGS. 13A through 13D are respective block diagrams of cross-sectional side views depicting exemplary portions of respective SiPs without wire bond wire EMI shielding and with vertically integrated microelectronic packages.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Interference in microelectronic devices may come from electric-magnetic interference ("EMI") and/or radio frequency interference ("RFI"). The following description of interference shielding may be used for either or both of these types of interference. However, for purposes of clarity by way of example and not limitation, generally only shielding from EMI is described below in additional detail.

Figure 1A:
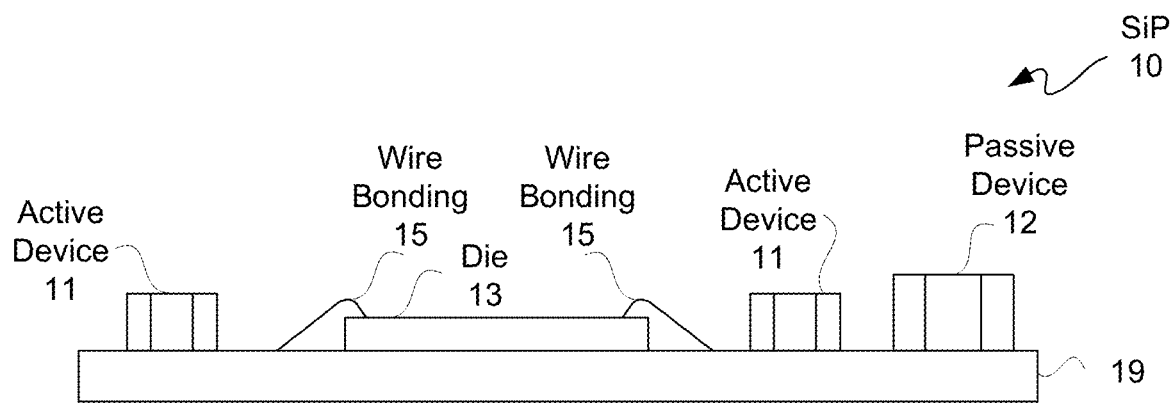
FIG. 1A is a block diagram of a side view depicting an exemplary conventional system-in-package ("SiP").

FIG. 1A is a block diagram of a side view depicting an exemplary conventional system-in-package ("SiP") 10 without EMI shielding. In SiP 10, there may be coupled to a package substrate 19 one or more active microelectronic devices 11, passive microelectronic devices 12, and/or IC dies 13. In this example, IC die 13, which may be a passive or active die, may be subject to EMI. IC die 13 may be wire bonded to package substrate 19 with wire bonds 15 for carrying input/output signals among other signals, a power supply voltage and a ground reference voltage.

Package substrate 19 may be formed of thin layers called laminates or laminate substrates. Laminates may be organic or inorganic. Examples of materials for "rigid" package substrates include an epoxy-based laminate such as FR4 or FR5, a resin-based laminate such as bismaleimide-triazine ("BT"), a ceramic substrate (e.g. a low temperature co-fired ceramic ("LTCC")), a glass substrate, or other form of rigid package substrate. Moreover, a package substrate 19 herein may be a PCB or other circuit board. Other known details regarding conventional SiP 10 are not described for purposes of clarity.

Figure 1B:
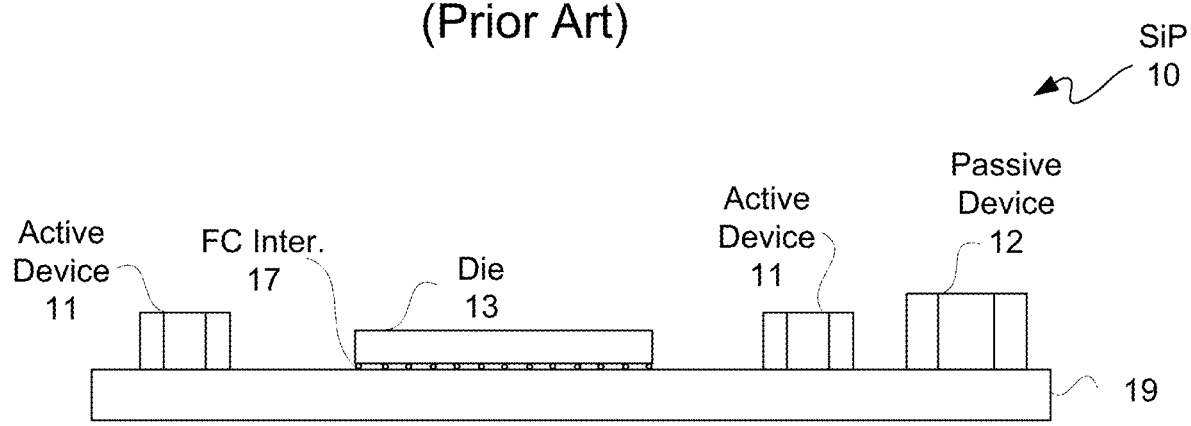
FIG. 1B is a block diagram of a side view depicting another exemplary conventional SiP.

FIG. 1B is a block diagram of a side view depicting another exemplary conventional SiP 10 without EMI shielding. SiP 10 of FIG. 1B is the same as SiP 10 of FIG. 1A, except rather than wire bonds 15, flip-chip ("FC") interconnects, such as microbumps, 17 are used. Even though microbump interconnects 17 are illustratively depicted, other types of die-surface mount interconnects may be used. Moreover, microbump interconnects 17 may be used in addition to wire bonds 15, though not illustratively depicted in FIG. 1B.

Figure 2:
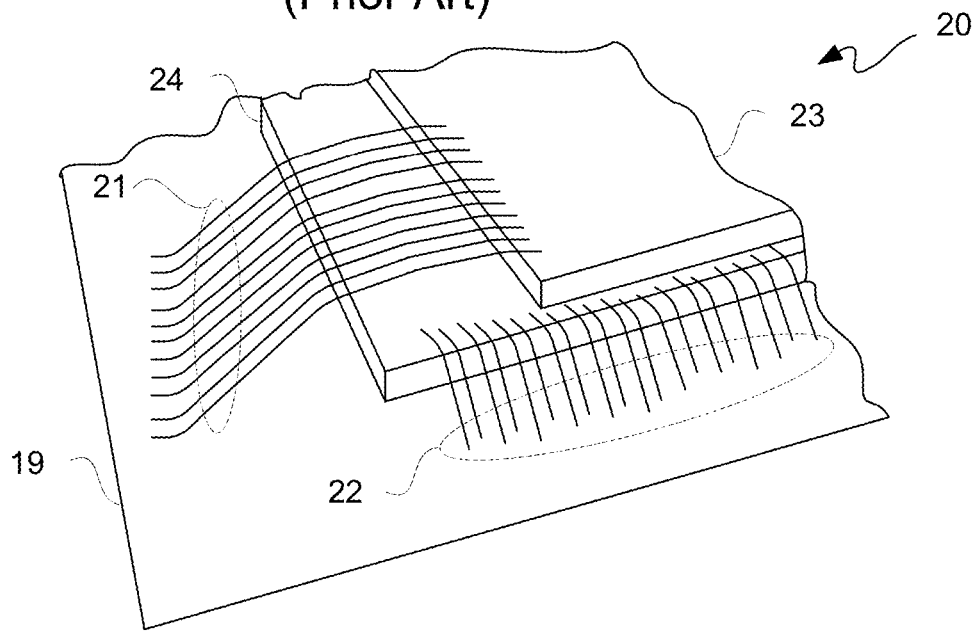
FIG. 2 is a corner top-down perspective view depicting an exemplary portion of a conventional EMI shielding.

FIG. 2 is a corner top-down perspective view depicting an exemplary portion of a conventional EMI shielding 20. In conventional EMI shielding 20, a top electrically conductive plate 23 may be disposed over a bottom conductive plate 24, where such bottom conductive plate 24 has a larger surface area than such top conductive plate 23.

Conductive plates 23 and 24 may be respectively coupled to a package substrate 19 with rows of wire bonds 21 and 22. Thus, two sides of top plate 23 may be wire bonded with corresponding rows of wire bonds 21, and likewise two sides of bottom plate 24 may be wire bonded with corresponding rows of wire bonds 22. Non-electrically conductive spacers (not shown) may be used to insulate wire bonds 21 from bottom conductive plate 24. A microelectronic device (not shown) to be EMI shielded may be sandwiched between top and bottom conductive plates 23 and 24. This type of EMI shielding with wire bonding may be too bulky for many applications. Furthermore, there may be gaps on opposite sides with respect to wire bonds providing side EMI shielding.

Interference Shielding

FIGS. 3A and 3B are top views of block diagrams depicting respective exemplary SiPs 100 with EMI shielding. Each of SiPs 100 may include a package substrate 19 having coupled to an upper surface 132 thereof one or more active microelectronic devices 11, one or more passive microelectronic devices 12, and wire bond wires 131, where lower ends of such wire bond wires 131 may be coupled to an upper surface 132 of package substrate 19. Upper surface 132 may be a conductive surface. Wire bond wires 131 may include wire diameters equal to or less than approximately 0.0508 millimeters (2 mils).

A portion of wire bond wires 131 may be positioned to define a shielding region 133. Along those lines, rows and columns of a BVA arrangement 136 of wire bond wires 131 may be used to encircle or otherwise surround a shielding region 133. Upper ends of at least a subset of such wire bond wires 131 surrounding a shielding region 133 may be used to support conductive surface 130, and such conductive surface 130 may be over such shielding region 133 for covering thereof.

Conductive surface 130 may be a rigid or flexible surface which is electrically conductive. In an implementation, conductive surface 130 may be flexible, such as a flexible conductive coating on a surface of a flexible sheet. In another implementation, a rigid plate may provide a conductive surface. A rigid plate may be made of a conductive material. However, a conductive coating may be sprayed or painted on a rigid plate or a flexible sheet. In the example of FIG. 3B, conductive surface 130 may have holes 137 for allowing upper portions of at least some of wire bond wires 131 defining a shielding region 133 to extend through conductive surface 130, as described below in additional detail.

FIG. 4 is a block diagram of a cross-sectional side view depicting an exemplary SiP 100 with EMI shielding. SiP 100 may include a package substrate 19 having coupled to an upper surface 132 thereof one or more active microelectronic devices 11, one or more passive microelectronic devices 12, and wire bond wires 131, where upper ends of such wire bond wires 131 may be coupled to a conductive surface 130. Even though a SiP 100 is described, another type of microelectronic package having protection from EMI may be used.

Package substrate 19 has an upper surface 132 and a lower surface 149 opposite the upper surface. Package substrate 19 may have a ground plane 140 and vias 142 located between surfaces 132 and 149, where vias 142 may be interconnected to such ground plane 140 for electrical conductivity.

Wire bond wires 131 may be coupled to ground plane 140 with vias 142. Some wire bond wires 131 may be mechanically coupled to upper surface 132 with ball bonds 141 for electrical conductivity; however, in other implementations, other types of bonding may be used. Moreover, not all wire bond wires 131 need be coupled to ground plane 140. Some wire bond wires 131 may be used for carrying supply voltages or signals within SiP 100. Some wire bond wires 131 may be used for coupling to other devices within SiP 100.

An active or passive microelectronic device 145 may be coupled to upper surface 132 of package substrate 19. Microelectronic device 145 may include an active integrated circuit die and/or a passive component. A passive component may be, e.g., a capacitor, an inductor, or a resistor, or any combination thereof.

Microelectronic device 145 may be coupled to package substrate 19 with ball or bump interconnects and/or wire bond wires, as previously described. Moreover, microelectronic device 145 may be coupled to upper surface 132 with an adhesive or an underfill layer (not shown).

Microelectronic device 145 may be disposed in a dielectric protective material which may be provided as dam fill or a molding layer ("molding layer") 143. Such molding layer 143 may be an encapsulant or a molding material for at least covering an upper surface and sidewalls of microelectronic device 145. Wire bond wires 131 may be disposed around sidewalls of microelectronic device 145.

Conductive surface 130 may be located upon or coupled to a top or upper surface 146 of dielectric protective material molding layer 143. However, in another implementation a top surface of dielectric protective material molding layer 143 may be at a higher level than tips 148 of wire bond wires 131, as described below in additional detail. Conductive surface 130 may be positioned over wire bond wires 131 associated with Faraday cage 153. Upper ends or tips 148 of such wire bond wires 131 may be mechanically coupled to conductive surface 130. This coupling may be with a heated press bonding or other form of mechanical coupling.

Faraday cage 153 may be a combination of a portion of ground plane 140 interconnected to wire bond wires 131, such as with vias 142, supporting a conductive surface 130. In another implementation, there may be a gap 144 between conductive surface 130 and tips 148 of some of wire bond wires 131. Along those lines, a bottom of conductive surface 130, such as of a conductive plate for example, may be attached to or rest upon a top surface of dielectric protective material molding layer 143, and height of dielectric protective material molding layer 143 may be greater than height of wire bond wires 131.

Thus, a conductive surface 130 may be positioned over a portion of wire bond wires 131 with upper ends or tips 148 thereof spaced apart from conductive surface 130. However, a configuration with a gap 144 may provide a less effective Faraday cage 153, and so for purposes of clarity by way of example and not limitation, it shall be assumed that there is no gap.

Wire bond wires 131 coupled to ground plane 140 projecting or extending upwardly away from upper surface 132 of package substrate 19 may be arrayed. Along those lines, even though single rows and columns of a Bond Via Array™ or BVA® arrangement 136 of wire bond wires 131 may be present in an implementation, multiple rows and/or multiple columns of wire bond wires 131 of a BVA arrangement 136, may be present along one or more sides of a shielding region 133.

To recapitulate, some of wire bond wires 131, such as in BVA arrangement 136 defining a shielding region 133, may be positioned to provide such a shielding region 133 for microelectronic device 145 from or with respect to EMI. Another portion of wire bond wires 131 located outside of shielding region 133 may not be used for EMI shielding. Moreover, one or more other active or passive microelectronic devices 11 and/or 12 may be coupled to substrate 19 and be located outside of shielding region 133 and not part of, or positioned for such shielding region.

FIG. 5 is a block diagram of a cross-sectional side view depicting an exemplary SiP 100 with a conductive cover 150 and with signal wire bond wires 131s in an EMI shielding region under conductive cover 150. SiP 100 of FIG. 5 is the same as SiP 100 of FIG. 4, but with the following differences.

In this example, a portion of wire bond wires 131 have a height that is greater than a height of another portion of wire bond wires 131. Both sets of wire bond wires 131 may be positioned proximate to and around microelectronic device 145. However, the portion of wire bond wires 131 that are taller may be for providing a shielding region 133 for microelectronic device 145 with respect to EMI. Whereas, the other portion of wire bond wires 131 that are shorter ("wire bond wires 131s") may be signal wires coupling microelectronic device 145 to conductors of package substrate 19. Some of such shorter wire bond wires 131s may be within a Faraday cage 153. Heights of taller wire bond wires 131 may be limited by low-profile package applications.

Conductive cover 150 may be coupled to upper surface 132 of package substrate 19. Conductive cover 150 may cover components of SiP 100 coupled to upper surface 132 including microelectronic device 145, microelectronic devices 11, 12 and wire bond wires 131. Wire bond wires 131 not part of BVA arrangement 136 may interconnect conductive cover 150 and ground plane 140. This coupling may be used to reduce internal noise. However, Faraday cage 153 may be located under cover 150 for internal EMI shielding. Optionally, conductive surface 130 may be omitted in favor of using conductive cover 150 as an upper conductive surface of Faraday cage 153, with or without a gap 144 between tips 148 and an underside of conductive cover 150.

Some wire bond wires 131 within BVA arrangement 136 may be signal wires, namely wire bond wires 131s. Wire bond wires 131s may not be coupled to ground plane 140, but may be coupled to traces (not shown) of package substrate 19. Tips of wire bond wires 131s may be bonded or soldered to microelectronic device 145 prior to use of dielectric protective material molding layer 143. In another implementation, dielectric protective material molding layer 143 may be omitted with respect to microelectronic device 145.

Wire bond wires 131s may be bonded to upper surfaces of one or more of passive microelectronic devices 12 or active microelectronic devices 11. These wire bond wires 131s may be for interconnection within SiP 100.

Figure 6:
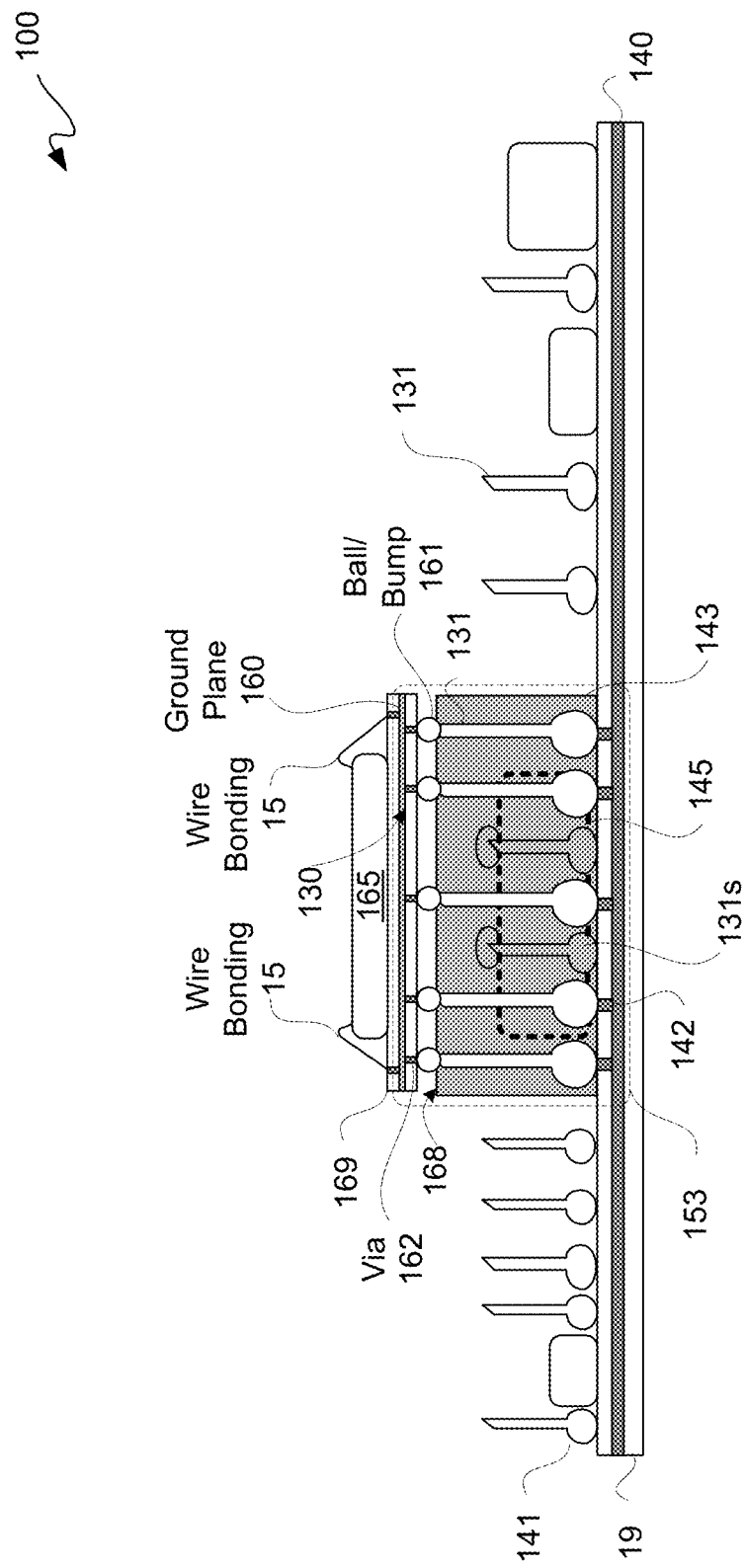
FIG. 6 is a block diagram of a cross-sectional side view depicting an exemplary SiP with EMI shielding using an upper substrate.

FIG. 6 is a block diagram of a cross-sectional side view depicting an exemplary SiP 100 with EMI shielding using an upper substrate 169. SiP 100 of FIG. 6 is the same as SiP 100 of FIG. 5, but without a conductive cover 150 and with the following differences.

Upper substrate 169 may include vias 162 and a ground plane 160. Tips or upper ends 148 of wire bond wires 131 may be interconnected to vias 162 along a bottom surface of upper substrate 169 with interconnects 161, such as with micro balls or microbumps for example, for coupling to ground plane 160. Interconnects 161 may be disposed on an upper surface 168 of dielectric protective material molding layer 143. Ground plane 160 may provide an upper conductive surface 130 of Faraday cage 153.

Another microelectronic device 165, whether active or passive, may be coupled to a top surface of upper substrate 169. Microelectronic device 165 may be coupled with wire bond wires 15 to vias or traces of substrate 169; however, micro balls or microbumps may be used in another implementation. Microelectronic device 165 may be coupled outside of Faraday cage 153.

Figure 7:
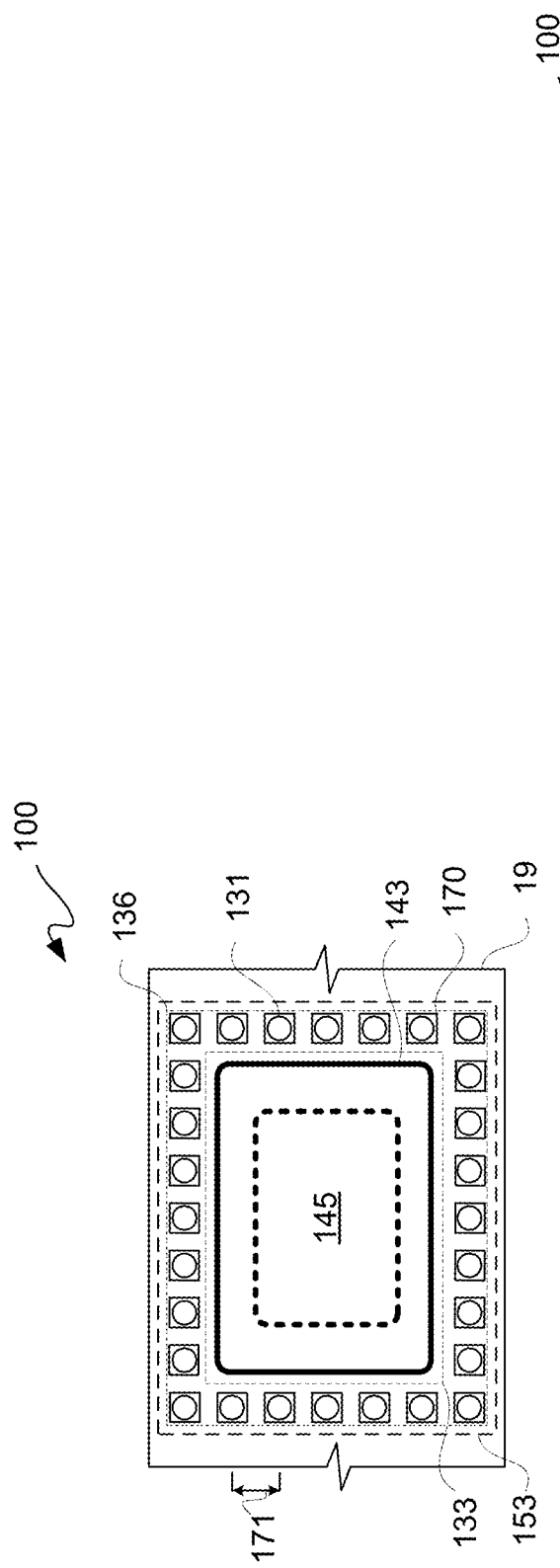
FIG. 7 is a block diagram of a top-down view depicting an exemplary portion of a SiP prior to addition of an upper conductive surface of a Faraday cage.

FIG. 7 is a block diagram of a top-down view depicting an exemplary portion of a SiP 100 prior to addition of an upper conductive surface 130 of a Faraday cage 153. Bond pads 170 may be positioned proximate to and around microelectronic device 145 for coupling wire bond wires 131 respectively thereto for providing shielding region 133 of Faraday cage 153. Shielding region 133 may be defined within a BVA arrangement 136.

Bond pads 170 may be spaced apart from one another around sides of dielectric protective material molding layer 143. Microelectronic device 145 in dielectric protective material molding layer 143 may be located in a central portion of shielding region 133. A pad-to-pad pitch 171 of bond pads 170 may be equal to or less than approximately 250 microns. Pitch 171 of bond pads 170 may be selected for frequencies associated with interference, such as EMI and/or RFI, to shield microelectronic device 145 from EMI and/or RFI. Moreover, microelectronic device 145 may be an interference radiator, and thus such shielding may be to protect other components of SiP 100 from interference generated by microelectronic device 145.

Even though single rows and columns of bond pads 170 are illustratively depicted, in another implementation there may be more than one or two rows and/or columns. Moreover, rows and/or columns of bond pads 170 may be interleaved with respect to one another to provide denser shielding. Effectively, wire bond wires 131 may be used to provide a low pass filter Faraday cage for reducing EMI with respect to operation of microelectronic device 145. Along those lines, placement of bond pads 170, and thus wire bond wires 131 may, though need not be, uniform. Wire bond wires 131 may be placed and/or adjusted for density tailored to shield a particular range of frequencies to or from microelectronic device 145.

Figure 8:
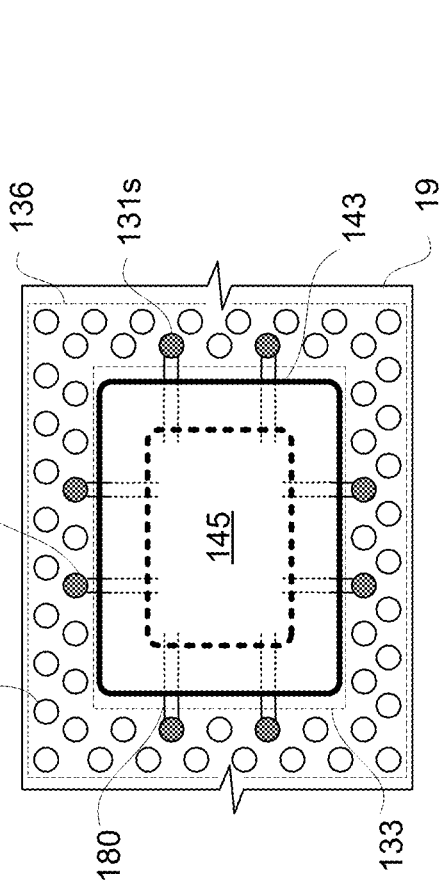
FIG. 8 is a block diagram of a top-down view depicting an exemplary portion of another SiP prior to addition of an upper conductive surface of a Faraday cage.

FIG. 8 is a block diagram of a top-down view depicting an exemplary portion of another SiP 100 prior to addition of an upper conductive surface 130 of a Faraday cage 153. In this example, two rows and two columns of a BVA arrangement 136 of wire bond wires 131 are used to define a shielding region 133. In this example, spacing between rows and columns is interleaved to provide a denser pattern of wire bond wires 131.

In this example, some of wire bond wires 131 of BVA arrangement 136 are for carrying signals, namely wire bond wires 131s. Along those lines, interconnects 180 may be formed for extending from microelectronic device 145 outside of dielectric protective material molding layer 143 for interconnection with wire bond wires 131s, which may include one or more signal wires.

FIG. 9A is a block diagram of a cross-sectional side view depicting an exemplary portion of a package-on-package ("PoP") device 190 with EMI shielding. PoP device 190 may include an upper SiP 100U stacked on top of a lower SiP 100L. PoP device 190 may include one or more other microelectronic devices outside of a shielding region as well as other details, such as previously described with reference to FIGS. 3A through 8 for example. Accordingly, previously described details for SiPs 100 are not described hereinbelow for purposes of clarity and not limitation.

A lower package substrate 19L of a lower SiP 100L may include a lower ground plane 140L having lower wire bond wires 131L extending upwardly from an upper surface of lower package substrate 19L. Such lower wire bond wires 131L and ground plane 140L may be interconnected to one another, such as with vias and ball bonds as previously described, for forming a lower portion of a Faraday cage 153. Tips 148 of lower wire bond wires 131L may be bonded or coupled with interconnects 191 to pads and vias therefor along an underneath side of upper package substrate 19U.

Optionally, upper package substrate 19U may include an upper ground plane 140U for forming a Faraday cage 153 as a stack of two Faraday cages, namely an upper Faraday cage 192U and a lower Faraday cage 192L. Each of Faraday cages 192U and 192L may include respective packaged microelectronic devices 145U and 145L respectively coupled to upper surfaces of package substrates 19U and 19L.

Upper ground plane 140U of upper substrate 19U may be located over a lower microelectronic device 145L, so tips or upper ends 148 of lower wire bond wires 131L may be interconnected to pads or contacts with interconnects 191 along an underside surface of upper package substrate 19U for electrical coupling to upper ground plane 140U. Upper wire bond wires 131U and optional ground plane 140U may be interconnected to one another, such as with vias and ball bonds as previously described, for forming an upper portion of a Faraday cage 153. Tips 148 of upper wire bond wires 131U may be bonded or coupled to conductive surface 130 for completing such upper Faraday cage 192U.

In another implementation, vias of upper substrate package 19U may interconnect lower wire bond wires 131L with upper wire bond wires 131U without being connected to an upper ground plane 140U to form a "two-story" or bi-level Faraday cage 153 for two microelectronic devices 145U, 145L. Even though only two levels are illustratively depicted, more than two levels may be used in other implementations.

FIG. 9B is a block diagram of a cross-sectional side view depicting an exemplary portion of another PoP device 190 with EMI shielding. PoP device 190 may include one or more other microelectronic devices outside of a shielding region as well as other details, such as previously described with reference to FIGS. 3A through 9A for example. Accordingly, previously described details for SiPs 100 are not described hereinbelow for purposes of clarity and not limitation.

PoP device 190 of FIG. 9B may be the same as PoP device 190 of FIG. 9A, except with the following differences. PoP device 190 of FIG. 9B may include signal wire bond wires 131s. Signal wire bond wires 131s may be located within Faraday cage 153, including within Faraday cage 192U.

Signal wire bond wires 131s in this configuration may extend upwardly from an upper surface of a lower microelectronic device 145L. Tips or upper ends 148 of wire bond wires 131s extending from an upper surface of lower microelectronic device 145L may be interconnected to an underneath side of upper package substrate 19U, such as with interconnects 191. Vias and/or traces (not shown) may electrically couple upper and low microelectronic devices 145 with signal wire bond wires 131s. Moreover, lower substrate package 19L may include vias and/or traces (not shown) for interconnection with lower microelectronic device 145.

Figure 10:
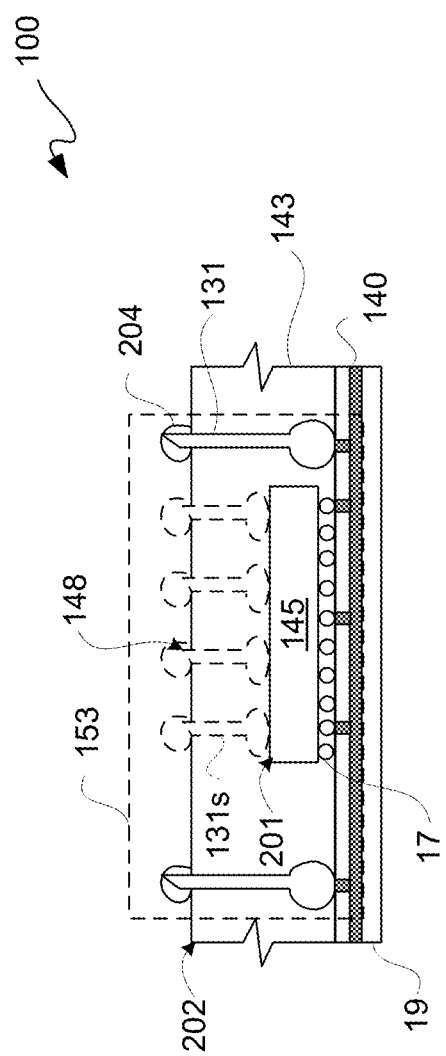
FIG. 10 is a block diagram of a cross-sectional side view depicting an exemplary portion of another SiP.

FIG. 10 is a block diagram of a cross-sectional side view depicting an exemplary portion of another SiP 100 with EMI shielding. SiP 100 may include one or more other microelectronic devices outside of a shielding region as well as other details, such as previously described with reference to FIGS. 3A through 9B for example. Accordingly, previously described details for SiPs 100 are not described hereinbelow for purposes of clarity and not limitation.

In this example, wire bond wires 131 and a microelectronic device 145, such as an IC die, are protected by a dielectric protective material molding layer 143. Microelectronic device 145 may be interconnected with microbump interconnects 17 to an upper surface of package substrate 19 prior to depositing or injecting dielectric protective material molding layer 143. Likewise, wire bond wires 131 may be ball bonded to an upper surface of package substrate 19 prior to depositing or injecting dielectric protective material molding layer 143.

Optionally, signal wire bond wires 131s may be ball bonded to an upper surface 201 of microelectronic device 145 prior to depositing or injecting dielectric protective material molding layer 143. Signal wire bond wires 131s thus may be within a shielding region 133 of a Faraday cage 153.

Tips or upper ends 148 of wire bond wires 131, as well as optional signal wire bond wires 131s, may extend above an upper surface 202 of dielectric protective material molding layer 143. Solder balls or other interconnect eutectic masses 204 may be deposited onto tips 148 for subsequent interconnection, such as described elsewhere herein.

Vertical Integration without Interference Shielding

FIG. 11A is a block diagram of a cross-sectional side view depicting an exemplary portion of a SiP 100 without wire bond wire EMI shielding. FIG. 11B is a block diagram of a cross-sectional side view depicting an exemplary portion of another SiP 100 without wire bond wire EMI shielding. With simultaneous reference to FIGS. 11A and 11B, SiPs 100 respectively illustratively depicted in those figures are further described. Each of SiPs 100 may include one or more other microelectronic devices as well as other details, such as previously described. Accordingly, previously described details for SiP 100 are not described hereinbelow for purposes of clarity and not limitation.

Each of SiPs 100 includes a vertically integrated microelectronic package 200. Each of microelectronic packages 200 includes a substrate 19 having an upper surface 132 and a lower surface 149 opposite the upper surface. Package substrate 19 may have located between surfaces 132 and 149 a ground plane 140 and vias 142 interconnected to such ground plane for electrical conductivity.

A microelectronic device 145 may be coupled to upper surface 132 of substrate 19, where microelectronic device is a passive microelectronic device. Along those lines, in a SiP 100 there may be one or more of either or both passive or active microelectronic devices coupled to upper surface 132. This means there are upper surfaces of such microelectronic devices that in the past may have gone unused for vertical integration, such as by having bonding wire bond wires attached to such upper surfaces of such microelectronic devices as described herein.

Along those lines, wire bond wires 131 may be coupled to and extend away from the upper surface 132 of substrate 19, and wire bond wires 231 may be coupled to and extend away from an upper surface 201 of microelectronic device 145. Wire bond wires 131 and 231 may be mechanically coupled to upper surfaces 132 and 201, respectively, with ball bonds 141 for electrical conductivity. However, in other implementations, other types of bonding may be used. Wire bond wires 231 are shorter in length than wire bond wires 131.

With reference to FIG. 11A, wire bond wires 131 may have an overall finished length 261, and wire bond wires 231 may have an overall finished length 262. However, finished heights of wire bond wires 131 and 231 may be approximately the same. Tips or upper ends 148 of wire bond wires 131 and 231 may extend above an upper surface 202 of molding layer 143.

Upper ends 148 may be coterminous for being generally coplanar. Solder balls or other interconnect eutectic masses 204 may be deposited on upper surface 202 respectively over upper ends 148 for forming interconnects with pads (not shown) on a front face underside of an active or a passive microelectronic device 165.

A passive microelectronic device 145 may be coupled to upper surface 132 of package substrate 19. Microelectronic device 145 may include conductive traces and may include only passive components. A passive component may include one or more of a capacitor, an inductor, or a resistor, or any combination thereof.

Microelectronic device 145 may be coupled to package substrate 19 with ball or bump interconnects and/or wire bond wires, as previously described. Moreover, microelectronic device 145 may be coupled to upper surface 132 with an adhesive or an underfill layer (not shown).

In this implementation, microelectronic device 145, as well as a microelectronic device 165, may have orientations facing downwardly, namely face-down orientations, toward upper surface 132 of substrate 19. However, in another implementation, microelectronic device 165 may have a front side face facing upwardly away from an upper surface 132 of substrate 19.

A microelectronic device 165 may be coupled above uppermost surface 202 of molding layer 143. In an implementation, a microelectronic device 165 may be coupled to upper ends 148 of wire bond wires 131 and 231 with eutectic masses 204 or other mechanical interconnects. Microelectronic device 165 may be located above microelectronic device 145 and at least partially overlap such microelectronic device 145.

Molding layer 143 may have an uppermost surface 202 and a lowermost surface 252 opposite the uppermost surface. Molding layer 143 may be disposed for surrounding portions of lengths 261 and 262 for both wire bond wires 131 and 231. Upper ends 148 may not be covered with molding layer 143, such as by use of a mold assist film for an injection molding for example. In another implementation, molding layer 143 may temporarily completely cover lengths 261 and 262 followed by an etch back to reveal upper ends 148.

In an implementation of a vertically integrated microelectronic package 200, microelectronic device 145 may be disposed in molding layer 143. Along those lines, in an implementation, microelectronic device 145 may be completely located between uppermost surface 202 and lowermost surface 252 of molding layer 143. Wire bond wires 131 may be disposed around sidewalls 203 of microelectronic device 145 though not for interference shielding in this example implementation.

Wire bond wires 131 may be coupled to ground plane 140 for projecting or extending upwardly away from upper surface 132 of package substrate 19 and may be arrayed. Along those lines, even though single rows and columns of a BVA® arrangement of wire bond wires 131 and/or 231 may be present in an implementation, multiple rows and/or multiple columns of such wire bond wires may be in a BVA® arrangement.

In an implementation of vertically integrated microelectronic package 200, microelectronic device 165, which is a passive microelectronic device, may be used. However, in another implementation of vertically integrated microelectronic package 200, microelectronic device 165, which is an active microelectronic device, may be used.

With reference to FIG. 11B, inner wire bond wires 131*i* may have an overall finished length 263, and wire bond wires 231 may have an overall finished length 264. Outer wire bond wires 131*o* may have an overall finished height 261, as previously described with reference to FIG. 11A. Finished heights of wire bond wires 131*i* and 231 may be approximately the same after forming. Upper ends 148 of wire bond wires 131*i* and 231 may generally even with one another.

Upper ends 148 of wire bond wires 131*i* and 231 may be coterminous for being generally coplanar. Solder balls or other interconnect eutectic masses 274 may couple a lower surface of an active or passive microelectronic device 271 respectively to upper ends 148 of wire bond wires 131*i* and 231 for forming interconnects with pads (not shown) on a front face underside of an active or passive microelectronic device 271. A molding material may be injected to form molding material layer 143 with microelectronic device 271 in place, and thus a lower surface of microelectronic device 271 may be in contact with molding material of molding layer 143. For molding, a mold assist film may be used to allow tips 148 of outer wire bond wires 131*o* to extend above upper surface 202 of molding layer 143, as well as pads or other interconnects (not shown) of microelectronic device 271. In another implementation, molding layer 143 may temporarily completely cover lengths 261 followed by an etch back to reveal upper ends 148 thereof.

Microelectronic device 271 may be coupled to and located above microelectronic device 145 and may at least partially overlap microelectronic device 145. Along those lines, microelectronic device 271 may laterally extend outside a perimeter of microelectronic device 145 for interconnection of inner wire bond wires 131*i* between upper surface 132 of substrate 19 and a lower surface of microelectronic device 271 facing such upper surface 132. Wire bond wires 131*i*, as well as wire bond wires 131*o*, may be disposed around sidewalls 203 of microelectronic device 145 though not for interference shielding in this example implementation.

Again, a passive microelectronic device 145 may be coupled to upper surface 132 of package substrate 19. Microelectronic device 145 may include conductive traces and may include only active components, only passive components or a combination thereof. A passive component may include a capacitor, an inductor, or a resistor, or any combination thereof. Microelectronic device 145 may be coupled to package substrate 19 with ball or bump interconnects and/or wire bond wires, as previously described. Moreover, microelectronic device 145 may be coupled to upper surface 132 with an adhesive or an underfill layer (not shown).

Molding layer 143 may have an uppermost surface 202 and a lowermost surface 252 opposite the uppermost surface. Molding layer 143 may be disposed for surrounding portions of lengths 261 of wire bond wires 131*o* and for surrounding lengths 263 and 264 for both wire bond wires 131*i* and 231.

In an implementation of vertically integrated microelectronic package 200, microelectronic device 145 may be disposed in molding layer 143 and completely located between uppermost surface 202 and lowermost surface 252 of molding layer 143. Microelectronic device 271 may be disposed in molding layer 143 and at least partially located between uppermost surface 202 and lowermost surface 252 of molding layer 143. Microelectronic device 165 may be coupled above uppermost surface 202 of molding layer 143.

For a passive microelectronic device 271, microelectronic device 271 may include conductive traces and may include only passive components. Microelectronic device 271 may include an RDL. A passive component may be a capacitor, an inductor, or a resistor, or any combination thereof. In this implementation, microelectronic devices 145 and 271, as well as microelectronic device 165, have orientations facing downwardly, namely face-down orientations, toward upper surface 132 of substrate 19. However, in another implementation, microelectronic device 165 and/or microelectronic device 271 may have a front side face facing upwardly away from an upper surface 132 of substrate 19.

In an implementation of vertically integrated microelectronic package 200, microelectronic device 165, which is a passive microelectronic device, may be used. However, in another implementation of vertically integrated microelectronic package 200, microelectronic device 165, which is an active microelectronic device, may be used. A microelectronic device 165 may be coupled above uppermost surface 202 of molding layer 143 for interconnection with microelectronic device 271. In an implementation, a microelectronic device 165 may be coupled to an upper surface of microelectronic device 271 with eutectic masses 204 or other mechanical interconnects for electrical conductivity.

Microelectronic device 165 may be located above microelectronic device 271 and at least partially overlap such microelectronic device 271. Along those lines, a microelectronic device 165 may be coupled above uppermost surface 202 of molding layer 143 for interconnection with upper ends 148 of outer wire bond wires 131o, as well as interconnection with an upper surface of microelectronic device 271.

Wire bond wires 131i and 131o may be coupled to ground plane 140 for projecting or extending upwardly away from upper surface 132 of package substrate 19 and may be arrayed. Along those lines, even though single rows and columns of a BVA® arrangement of wire bond wires 131i, 131o, and/or 231 may be present in an implementation, multiple rows and/or multiple columns of such wire bond wires may be in a BVA® arrangement.

Figure 12A:
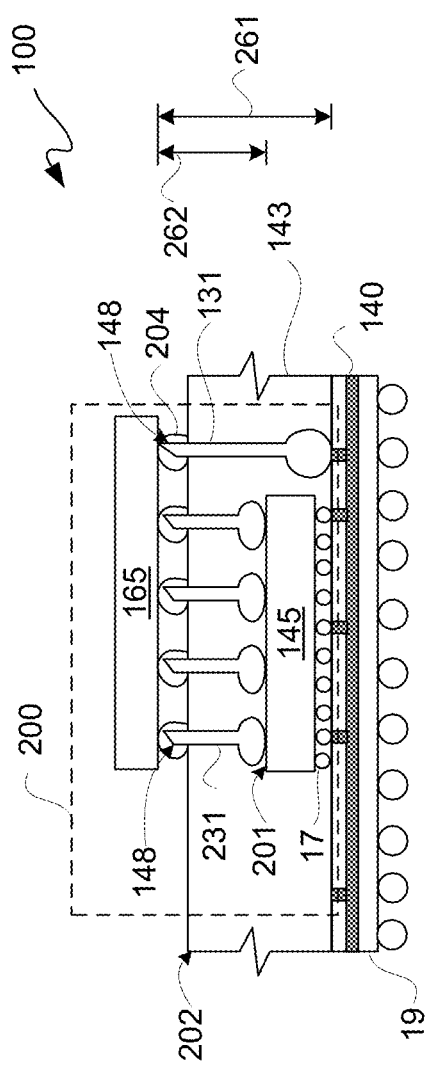
FIGS. 12A through 12D are respective block diagrams of cross-sectional side views depicting exemplary portions of respective SiPs without wire bond wire EMI shielding.

FIG. 12A is a block diagram of a cross-sectional side view depicting an exemplary portion of another SiP 100 without wire bond wire EMI shielding. SiP 100 of FIG. 12A may be the same as in FIG. 11A, except for the following details. In this implementation of a vertically integrated microelectronic package 200, microelectronic device 165 may be cantilevered for laterally extending over and above a wire bond wire 131. Along those lines, upper ends 148 of wire bond wires 131 may be interconnected with eutectic masses 204 to a lower surface of a microelectronic device 165.

Figure 12B:
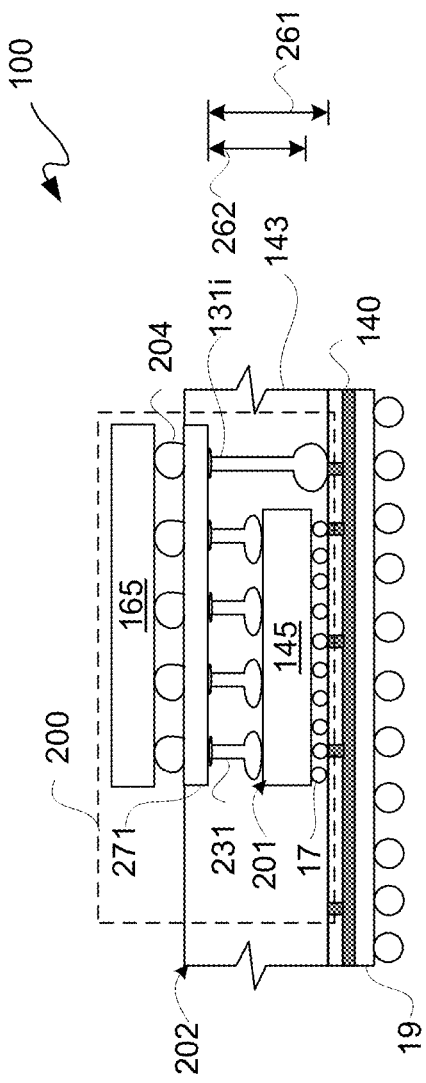

FIG. 12B is a block diagram of a cross-sectional side view depicting an exemplary portion of another SiP 100 without wire bond wire EMI shielding. SiP 100 of FIG. 12B may be the same as in FIG. 11B, except for the following details. In this implementation of a vertically integrated microelectronic package 200, microelectronic device 165 is not cantilevered for laterally extending over and above a wire bond wire 131i. Along those lines, microelectronic device 165 and microelectronic device 271 may have approximately equal surface areas for lower and upper surfaces respectively thereof.

Figure 12C:
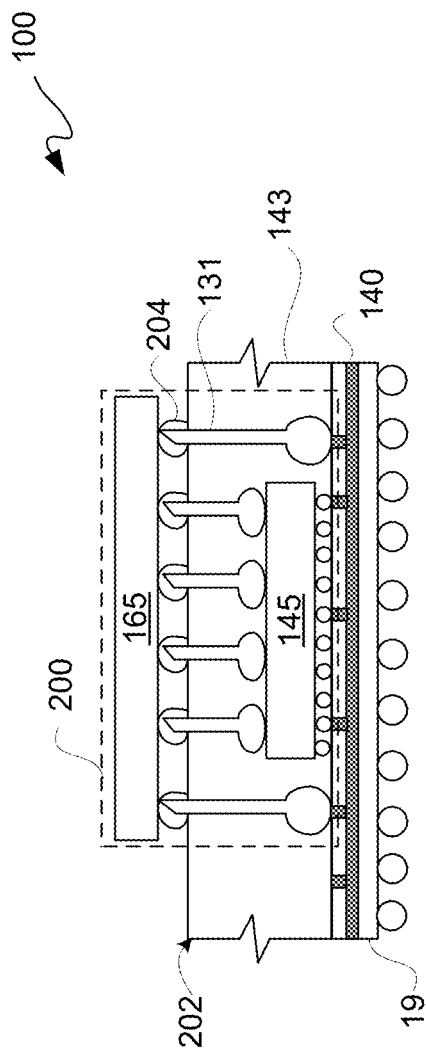

FIG. 12C is a block diagram of a cross-sectional side view depicting an exemplary portion of another SiP 100 with or without integrated wire bond wire EMI shielding. SiP 100 of FIG. 12C may be the same as in FIG. 12A, except for the following details. In this implementation of a vertically integrated microelectronic package 200, microelectronic device 165 is cantilevered for laterally extending over and above wire bond wires 131 on both a right and a left side of microelectronic device 145 in the figure. Along those lines, upper ends 148 of wire bond wires 131 may be interconnected with eutectic masses 204 to a lower surface of a microelectronic device 165. Accordingly, it should be appreciated that wire bond wires 131 disposed around a microelectronic device and interconnected to a microelectronic device 165 may be used for fan-out.

Figure 12D:
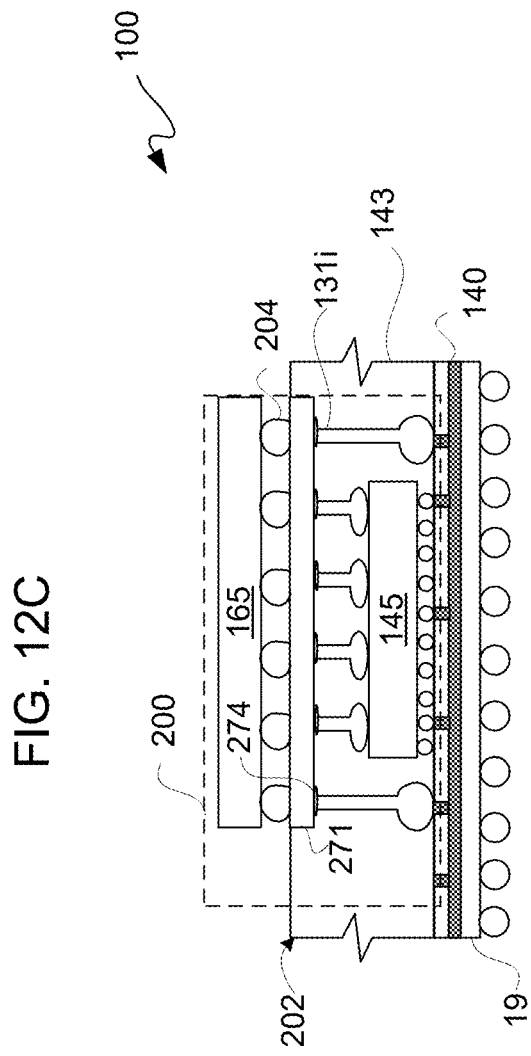

FIG. 12D is a block diagram of a cross-sectional side view depicting an exemplary portion of another SiP 100 with or without integrated wire bond wire EMI shielding. SiP 100 of FIG. 12D may be the same as in FIG. 12B, except for the following details. In this implementation of a vertically integrated microelectronic package 200, microelectronic device 165 is not cantilevered for laterally extending over and above a wire bond wire 131o. Along those lines, microelectronic device 165 and microelectronic device 271 may have approximately equal surface areas for lower and upper surfaces respectively thereof. Along those lines, upper ends 148 of wire bond wires 131i may be interconnected with eutectic masses 274 to a lower surface of a microelectronic device 271. Accordingly, it should be appreciated that wire bond wires 131i disposed around a microelectronic device 145 and interconnected to a microelectronic device 271 may be used for fan-out.

FIG. 13A is a block diagram of a cross-sectional side view depicting an exemplary SiP 100 with a vertically integrated microelectronic package 200. In this implementation, a vertically integrated microelectronic package 200 may be a stand-alone package coupled to substrate 19 as in FIG. 12D of a SiP 100. As components of SiP 100 have been previously described, such as with reference to FIG. 4 for example, such description is not repeated.

In this implementation, eutectic masses 274, such as solder balls, are formed on an upper surface 202 of molding layer 143, on a redistribution layer, or on tips of the wire bond wire bond wires 131i and 231. Eutectic masses 274 interconnect upper ends 148 of wire bond wires 131i and 231 to a lower surface of microelectronic device 271. In another implementation, eutectic masses 274 may be encapsulated in molding layer 143. In this example, a lower surface of microelectronic device 271 is not in contact with an upper surface 202 of molding layer 143.

Moreover, in this example implementation, signal wire bond wires 131s may be encapsulated in molding material of molding layer 143, excluding contact ends thereof. Signal wire bond wires 131s may be shorter than inner wire bond wires 131i and may be as previously described for interconnection with a microelectronic device 145. Along those lines, microelectronic device 271 may be coupled to upper ends 148 of a taller portion of wire bond wires 131 coupled to upper surface 132, such as wire bond wires 131i. Microelectronic device 271 may further be coupled to upper ends 148 of wire bond wires 231. Another portion of wire bond wires 131 coupled to upper surface 132, such as signal wire bond wires 131s, may have upper ends 148 thereof coupled to an upper surface of microelectronic device 145, such as previously described.

Optionally, wire bond wires 331 may be coupled to one or more upper surfaces of active microelectronic devices 11 and/or passive microelectronic devices 12, which microelectronic devices 11 and/or 12 are directly coupled to an upper surface 132 of substrate 19.

Other details regarding SiP 100 of FIG. 13A have been previously described, and thus are not repeated for purposes of clarity and not limitation.

FIG. 13B is a block diagram of a cross-sectional side view depicting an exemplary SiP 100 without EMI shielding and with a vertically integrated microelectronic package 200. In this implementation, a vertically integrated microelectronic package 200 may be a stand-alone package coupled to substrate 19 as in FIG. 13A of a SiP 100. As components of SiP 100 have been previously described, such as with reference to FIG. 4 for example, such description is not repeated.

SiP 100 of FIG. 13B is similar to SiP 100 of FIG. 13A, except for the following differences. In SiP 100 of FIG. 13B, vertically integrated microelectronic package 200 omits microelectronic device 271. Thus, a microelectronic device 165 may be directly coupled to an upper surface 202 of molding layer 143 with eutectic masses 204, such as previously described.

Figure 13C:
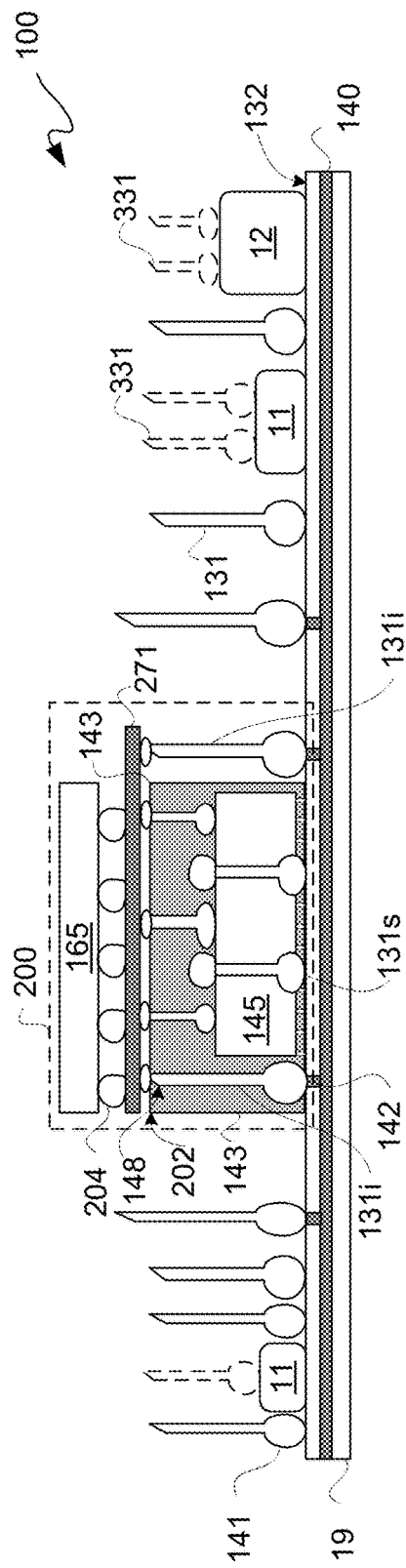

FIG. 13C is a block diagram of a cross-sectional side view depicting an exemplary SiP 100 with a vertically integrated microelectronic package 200. In this implementation, a vertically integrated microelectronic package 200 may be a stand-alone package coupled to substrate 19 as in FIG. 13A of a SiP 100. As components of SiP 100 have been previously described, such as with reference to FIG. 4 for example, such description is not repeated.

SiP 100 of FIG. 13C is similar to SiP 100 of FIG. 13A, except for the following differences. In SiP 100 of FIG. 13C, vertically integrated microelectronic package 200 has some wire bond wires 131i encapsulated in molding material of molding layer 143 as previously described and has some wire bond wires 131i not encapsulated in molding material of molding layer 143.

Figure 13D:
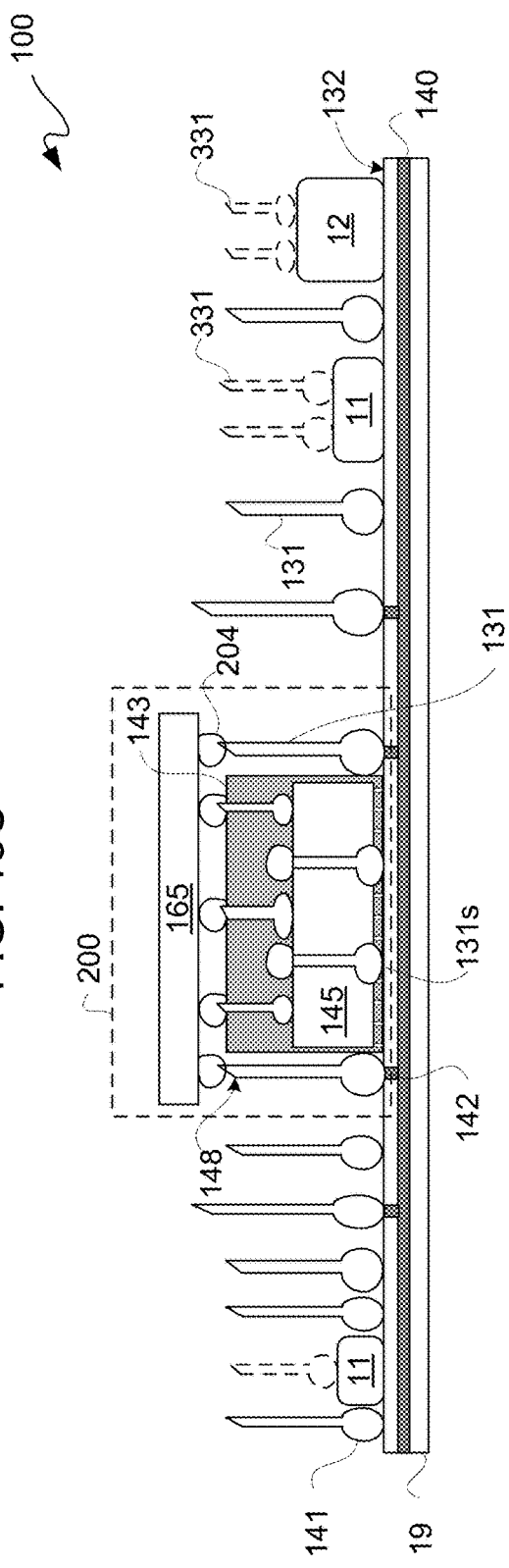

FIG. 13D is a block diagram of a cross-sectional side view depicting an exemplary SiP 100 with a vertically integrated microelectronic package 200. In this implementation, a vertically integrated microelectronic package 200 may be a stand-alone package coupled to substrate 19 as in FIG. 13B of a SiP 100. As components of SiP 100 have been previously described, such as with reference to FIG. 4 for example, such description is not repeated.

SiP 100 of FIG. 13D is similar to SiP 100 of FIG. 13B, except for the following differences. In SiP 100 of FIG. 13D, vertically integrated microelectronic package 200 does not have wire bond wires 131 encapsulated in molding material of molding layer 143.

Figure 14A:
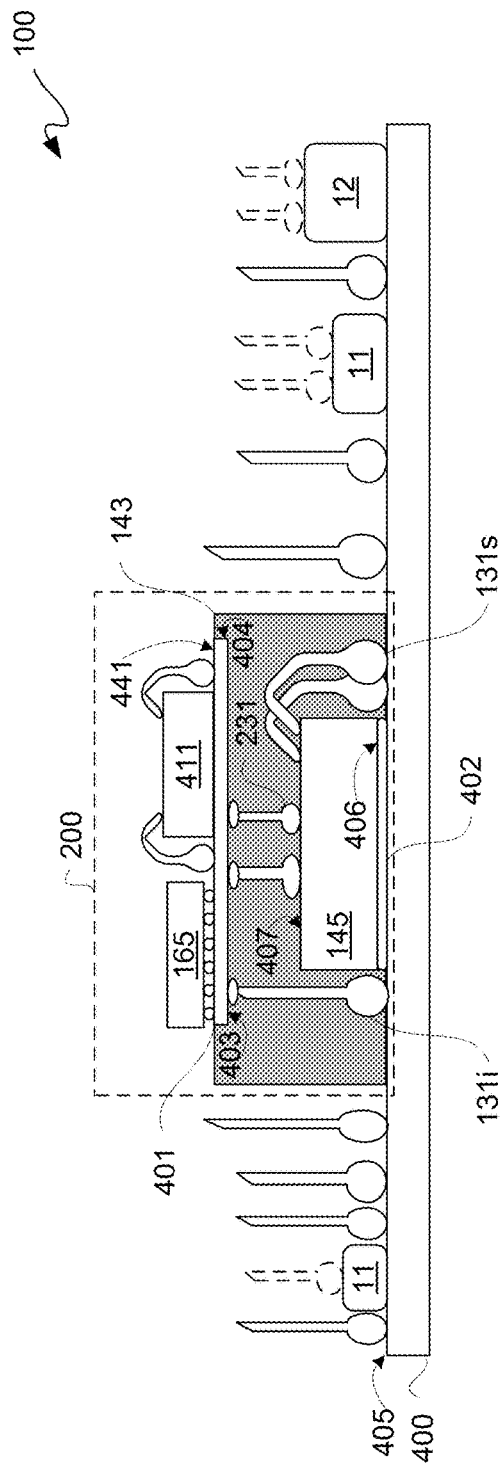
FIGS. 14A through 14D are respective block diagrams of cross-sectional side views depicting exemplary SiPs for a vertically integrated microelectronic package.

FIG. 14A is a block diagram of a cross-sectional side view depicting an exemplary SiP 100 with a vertically integrated microelectronic package 200. As SiP 100 of FIG. 14A is similar to SiPs 100 previously described herein, generally only the differences are described below in additional detail for purposes of clarity.

In this example implementation, a circuit platform 400 may be a package substrate such as package substrate 19, a die substrate or interposer, a lead frame, or a routing layer, such as an RDL for example. In this example, a passive microelectronic device 271 is generally represented as a circuit platform 401, which may be a routing layer, a die substrate or interposer, or a package substrate. Vertical wire bond wires 131i may interconnect an upper surface 405 of circuit platform 400 to a lower surface 403 of circuit platform 401. In this example, microelectronic device 145 is a wire bond-only device, which has a lower surface 406 thereof coupled to an upper surface 405 of circuit platform 401 with an epoxy or other adhesive layer 402 between such facing surfaces.

Microelectronic device 145 may be in a face-up orientation. Wire bond wires 131s may interconnect an upper surface 405 of circuit platform 401 to an upper surface 407 of microelectronic device 145. Shorter vertical wire bond wires 231 may interconnect an upper surface 407 of microelectronic device 145 with a lower surface 403 of circuit platform 401.

Dielectric protective material molding layer 143 may be a molding layer or a dam-fill layer and, while shown only covering a portion of the SIP, may alternatively cover any or all of the components in the SIP 100. Microelectronic device 145 may be coupled with adhesive layer 402 to circuit platform 400, followed by wire bonding wire bond wires 131s and 231. Wire bond wires 231 and 131i may be coupled to a lower surface 403 of circuit platform 401, prior to adding a molding or dam-filling layer of dielectric protective material molding layer 143. Dielectric protective material may provide a more rigid structure than just having wire bond wires 131i and 231 support circuit platform 401, as a lower surface 403 and at least portions of a sidewall surface(s) 404 may be covered with such dielectric protective material molding layer 143.

Figure 14B:
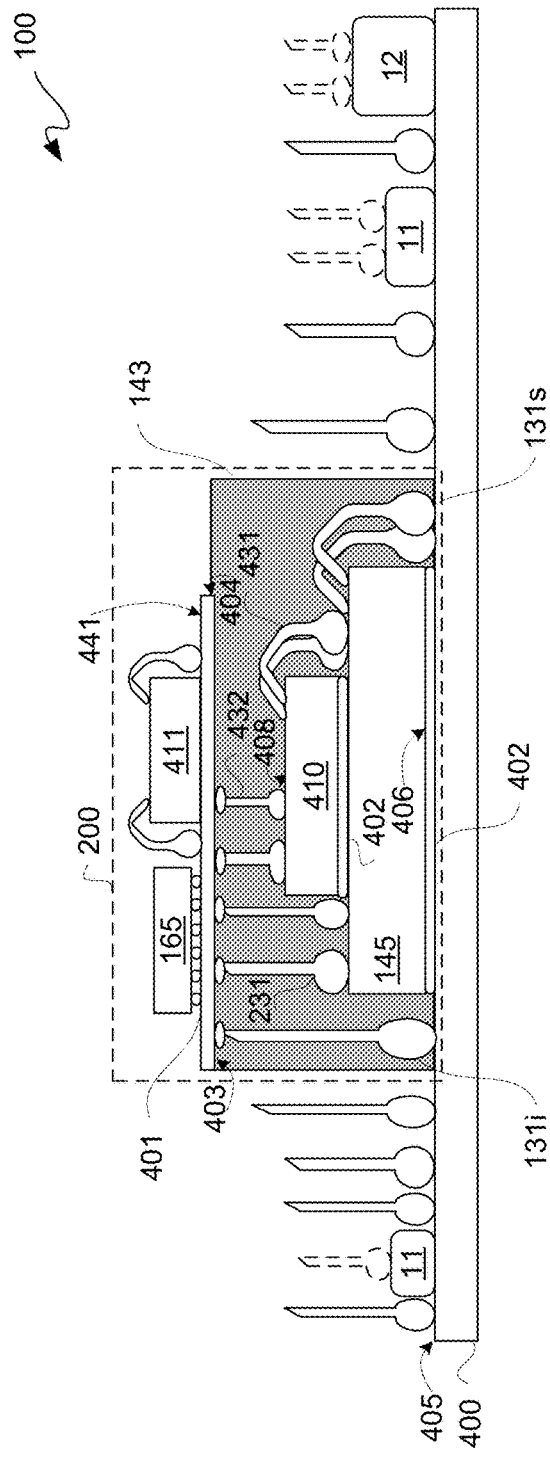

FIG. 14B is a block diagram of a cross-sectional side view depicting an exemplary SiP 100 with a vertically integrated microelectronic package 200. As SiP 100 of FIG. 14B is similar to SiP 100 of FIG. 14A, generally only the differences are described below in additional detail.

In addition to wire bond wires 231 on an upper surface 407 of microelectronic device 145, another microelectronic device 410 may have a lower surface thereof coupled to an upper surface of microelectronic device 145 with another epoxy or other adhesive layer 402 between such facing surfaces. Another set of interconnects provided with vertical wire bond wires 432 may be coupled between an upper surface of microelectronic device 410 and a lower surface 403 of circuit platform 401 for electrical communication between microelectronic device 410 and circuit platform 401. Microelectronic devices 145 and 410 may in combination form a die stack with both of such devices in a face-up orientation for wire bonding to upper surfaces thereof.

Furthermore, in addition to having a starting placement of wire bond wires 231 and microelectronic device 410 on upper surface 407 of microelectronic device 145, another set of wire bond wires 431 may be coupled to upper surface 407 for interconnection with an upper surface 408 of microelectronic device 410. Wire bond wires 431 may arc over for coupling to upper surface 408. These wire bond wires 431 may thus interconnect upper faces of microelectronic devices 145 and 410 to one another. Microelectronic devices 145 and 410 may be active devices, passive devices, or a combination of active and passive devices.

With simultaneous reference to FIGS. 14A and 14B, coupled to circuit platform 401 may be either or both a surface mount technology ("SMT") component, which may be an active or a passive SMT microelectronic device 165, and a wire bond mount component, such as an active or a passive wire bond microelectronic device 411. An active or a passive SMT microelectronic device 165 may be mounted face down to an upper surface 441 of circuit platform 401, and an active or a passive wire bond microelectronic device 411 may be mounted face-up to upper surface 441 of circuit platform 401.

Figure 14C:
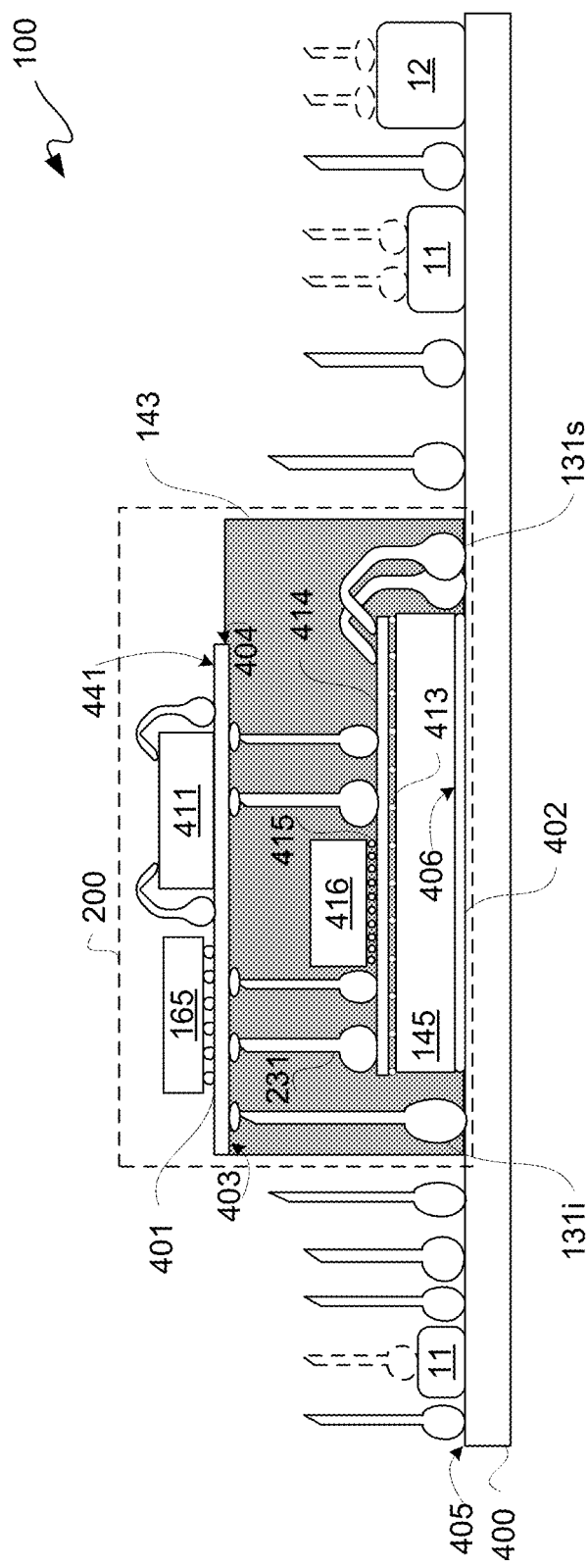

FIG. 14C is a block diagram of a cross-sectional side view depicting an exemplary SiP 100 with a vertically integrated microelectronic package 200. As SiP 100 of FIG. 14B is similar to SiP 100 of FIGS. 14A and 14B, generally only the differences are described below in additional detail.

In this example implementation, a lower surface of an interposer or other circuit platform 414 is interconnected to contacts on an upper surface of a face-up microelectronic device 145 with microbumps or other small form factor interconnects 413. An upper surface of interposer 414 is interconnected to contacts on a lower surface of a face-down microelectronic device 416 with microbumps or other small form factor interconnects 415. Distal ends of wire bond wires 131s may be coupled to an upper surface of interposer 414 for interconnection to an upper surface 405 of circuit platform 400. Proximal or lower ends of wire bond wires 231 may be coupled to an upper surface of interposer 414, with distal or upper ends of such wire bond wires coupled to lower surface 403 of circuit platform 401. By using an interposer 414 and flip-chip or like microelectronic device 416, more area for wire bond wires 231 and/or 131s may be provided, along with more interconnections between microelectronic devices 145 and 416.

Figure 14D:
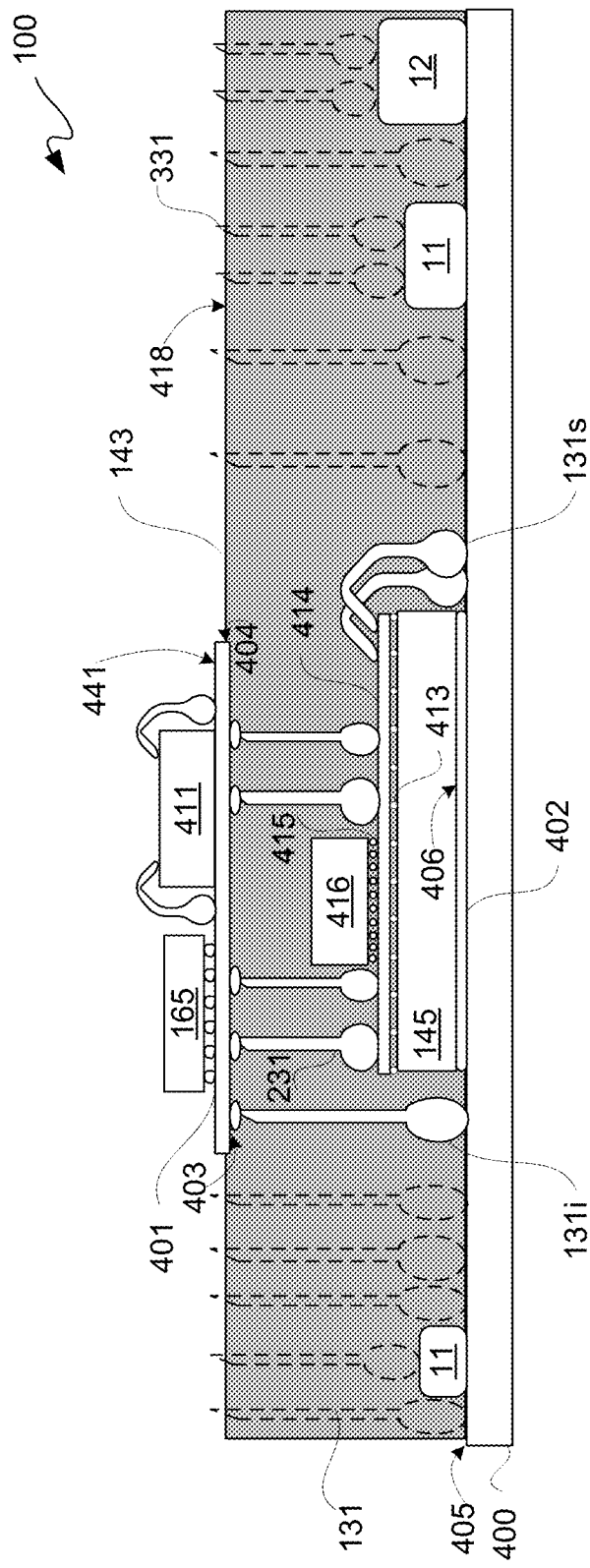

FIG. 14D is the block diagram of FIG. 14C, though with a molding layer of a protective dielectric material 143 covering circuit platform 400. This molding layer of protective dielectric material 143 provides interconnect surface 418 above an upper surface 405 of circuit platform 400. Wire bond wires 131 and 331 may have tips or upper ends thereof extend above surface 418 for interconnection of one or more passive or active circuits.

These are some of a variety of implementations of a vertically integrated microelectronic package 200 for a SiP 100. These or other implementations may be provided in accordance with the description herein.

Wire Bond on Solder

It has been assumed that wire bond wires are wirebonded onto a conductive metal layer, such as copper for example. However, as described below in additional detail, wire bond wires may be wirebonded onto solder. Along those lines, Electroless Nickel (Ni) Electroless Palladium (Pd) Immersion Gold (Au) ("ENEPIG") is a surface finish for substrate fabrication, such as for ICs. However, as IC manufacturers move away from ENEPIG substrates for flip-chip applications, having a substrate with a mix of copper with an organic surface protection ("OSP") layer and an ENEPIG finish is problematic. Along those lines, as described below in additional detail a copper OSP uses a solder-on-pad ("SOP") for a laminated surface, where wire bond wires, such as of BVA™ pins, are bonded onto such solder.

FIGS. 15A through 15D are block diagrams of side views depicting a progression formation of wire bond pads and flip-chip pads on a same substrate 600. Substrate 600 may be a package substrate or other substrate as described hereinabove for a SiP or other microelectronic component 650. Along those lines, wire bond pads with solder as described below in additional detail may be used for above-described wire bond wires, such as ball bonded for example, to such pads.

Figure 15A:
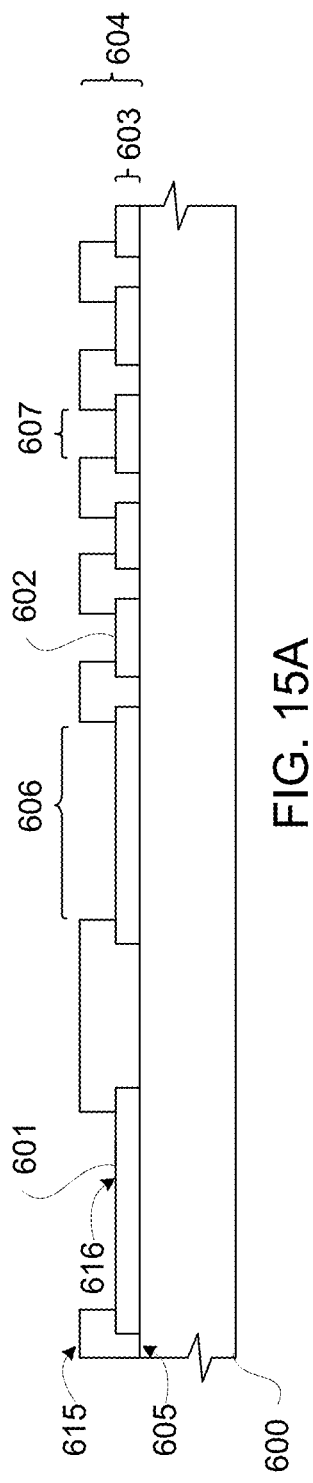
FIGS. 15A through 15D are block diagrams of side views depicting a progression formation of wire bond pads and flip-chip pads on a same substrate.

With reference to FIG. 15A, substrate 600 may have deposited, plated, or otherwise formed on an upper surface 605 thereof a conductive layer 603, such as a layer of copper or other conductive metallic layer for example. Conductive layer 603 may be patterned for providing both wire bond pads 601 and flip-chip or like small form factor pads 602 on upper surface 605.

A solder mask 604 may be deposited and patterned. Along those lines, an upper surface 616 of conductive layer 603 may be below an upper surface 615 of solder mask 604, and portions of solder mask 604 may be located between neighboring pads of pads 601 and 602. Along those lines solder mask 604 may have gaps 606 for access to wire bond pads 601 and narrower gaps 607 for access to flip-chip pads 602.

Figure 15B:
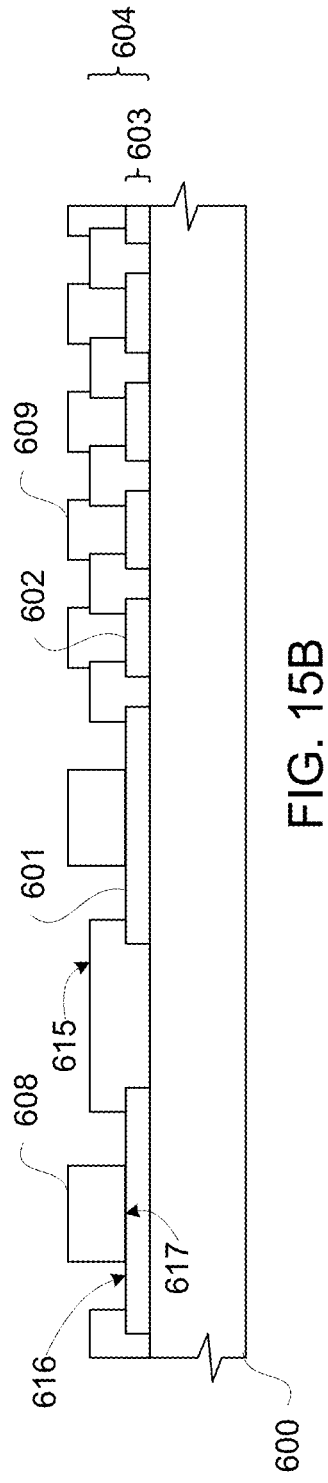

With reference to FIG. 15B, solder or other eutectic pads 608 and 609 of a solder or other eutectic layer may be printed onto upper surfaces 616 of pads 601 and 602. The ratio of a surface area of an exposed upper surface 616 of a wire bond pad 601 to a surface area of a lower surface 617 of a solder pad 608 resting thereon may be substantially smaller than the ratio of a surface area of an exposed upper surface 616 of a wire bond pad 602 to a surface area of a lower surface 617 of a solder pad 609 resting thereon. A portion of each of solder pads 608 and 609 may be higher than upper surface 615 of solder mask 604, and a portion of solder pad 609 may overlap onto upper surface 615. Upper surface 615 is above or higher than upper surfaces 616.

Figure 15C:
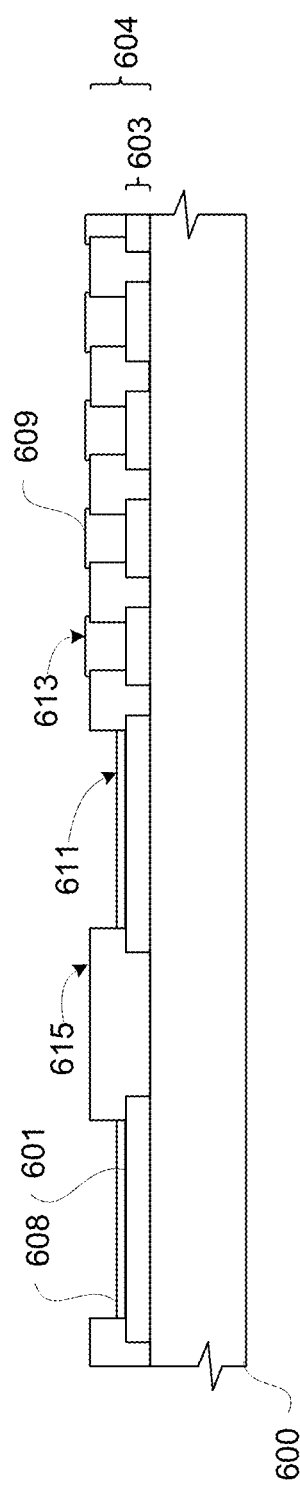

With reference to FIG. 15C, after reflow of solder pads 608 and 609, solder thereof may spread out, and a volume of flux may be eliminated. Along those lines, a solder pad 608 may spread out over what was an exposed surface area of wire bond pad 601 corresponding thereto. Along those lines, upper surfaces 611 of solder pads 608 after reflow may be below or lower than upper surface 615 of solder mask layer 604. However, upper surfaces 613 of solder pads 609 after reflow may be above, and may overlap, upper surface 615 of solder mask layer 604. Optionally, after reflow, solder pads 609 may be tamped down for flattening.

Figure 15D:
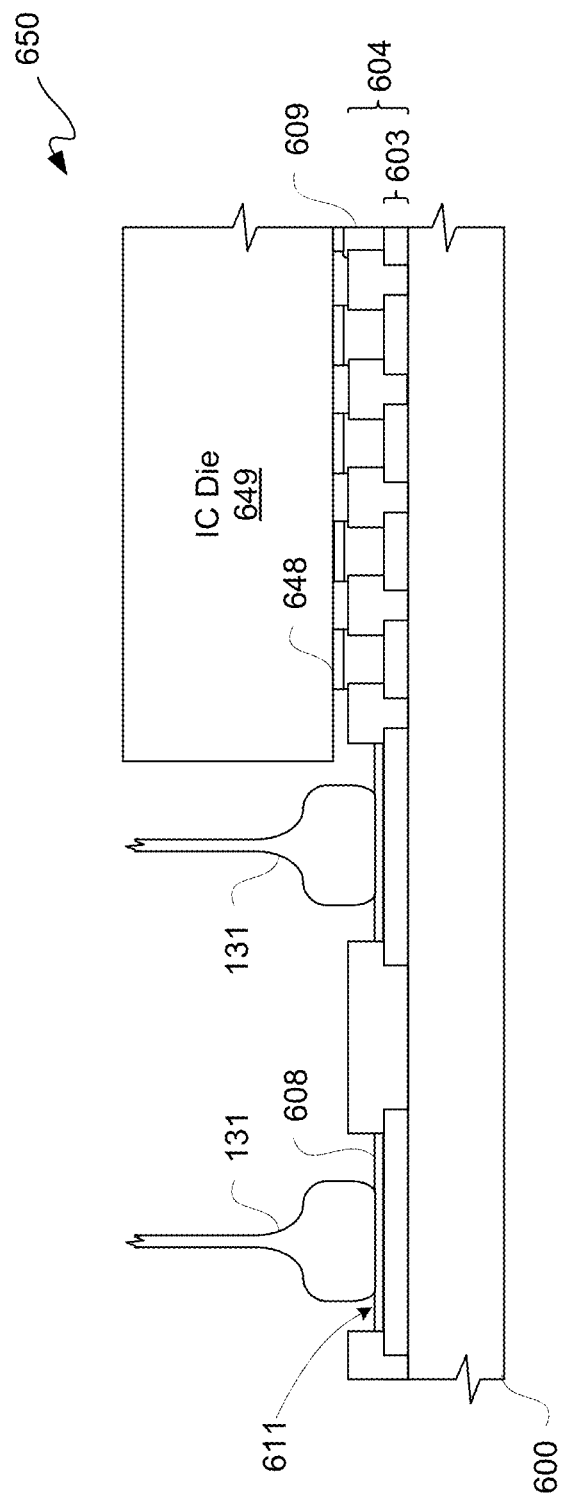

With reference to FIG. 15D, wire bond wires, such as wire bond wires 131 for example, may be bonded, such as ball, stitch or otherwise, to solder pads 608. Along those lines, solder along upper surfaces 611 of solder pads 608 may adhere to copper, palladium or other material of wire bond wires 131. A flip-chip IC die 649 may have flip-chip contacts 648, such as microbumps for example, respectively coupled to solder pads 609.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A vertically integrated microelectronic package, comprising:
 a substrate having an upper surface and a lower surface opposite the upper surface;
 a first microelectronic device coupled to the upper surface of the substrate, the first microelectronic device being a passive microelectronic device;
 first wire bond wires coupled to and extending away from the upper surface of the substrate;
 second wire bond wires coupled to and extending away from an upper surface of the first microelectronic device, the second wire bond wires being shorter than the first wire bond wires;
 a second microelectronic device coupled to upper ends, including corresponding tips, of the first wire bond wires and the second wire bond wires, the second microelectronic device located above the first microelectronic device and at least partially overlapping the first microelectronic device;
 a molding layer having an uppermost surface and a lowermost surface opposite the uppermost surface, the molding layer disposed for surrounding portions of lengths of a first subset of the first wire bond wires and portions of lengths of second wire bond wires; wherein the upper ends of the first subset of the first wire bond wires, the upper ends of the second subset of the first wire bond wires and the upper ends of the second wire bond directly interconnect the second microelectronic device above the uppermost surface of the molding layer;
 wherein the second subset of the first wire bond wires are located outside of the molding layer;
 the first microelectronic device is disposed in the molding layer and completely located between the uppermost surface and the lowermost surface of the molding layer;
 the second microelectronic device is coupled above the uppermost surface of the molding layer;
 a third microelectronic device coupled to and located above the second microelectronic device and at least partially overlapping the second microelectronic device;
 wherein the third microelectronic device is coupled above the uppermost surface of the molding layer; and
 wherein both the first microelectronic device and the third microelectronic device are in a face-down orientation for facing the upper surface of the substrate.

2. The vertically integrated microelectronic package according to claim 1, wherein the second microelectronic device is a passive microelectronic device.

3. The vertically integrated microelectronic package according to claim 1, wherein the second microelectronic device is an active microelectronic device.

4. The vertically integrated microelectronic package according to claim 1, wherein both the first microelectronic device and the second microelectronic device are in a face-down orientation for facing the upper surface of the substrate.

5. The vertically integrated microelectronic package according to claim 1, wherein the second microelectronic device and the third microelectronic device are respective passive microelectronic devices.

6. The vertically integrated microelectronic package according to claim 1, wherein the second microelectronic device and the third microelectronic device respectively are another passive microelectronic device and an active microelectronic device.

7. The vertically integrated microelectronic package according to claim 1, wherein
the third microelectronic device is an active microelectronic device.

8. A vertically integrated microelectronic package, comprising:
a substrate having an upper surface and a lower surface opposite the upper surface;
a first microelectronic device coupled to the upper surface of the substrate, the first microelectronic device being a passive microelectronic device;
first wire bond wires coupled to and extending away from the upper surface of the substrate;
second wire bond wires coupled to and extending away from an upper surface of the first microelectronic device;
a first portion of the first wire bond wires being taller than the second wire bond wires;
a second microelectronic device coupled to first upper ends of the first portion the first wire bond wires and coupled to upper ends, including corresponding tips, of the second wire bond wires, the second microelectronic device located above the first microelectronic device and at least partially overlapping the first microelectronic device;
a second portion of the first wire bond wires having second upper ends thereof coupled to the upper surface of the first microelectronic device;
a molding layer having an uppermost surface and a lowermost surface opposite the uppermost surface disposed for surrounding lengths of both the first wire bond wires and the second wire bond wires with the first upper ends of the first portion of the first wire bond wires and the upper ends of the second wire bond wires directly interconnected to the second microelectronic device above the uppermost surface;
the first microelectronic device disposed in the molding layer and completely located between the uppermost surface and the lowermost surface of the molding layer;
the second microelectronic device coupled above the uppermost surface of the molding layer;
a third microelectronic device coupled to and located above the second microelectronic device and at least partially overlapping the second microelectronic device;
wherein the third microelectronic device is coupled above the uppermost surface of the molding layer; and
wherein both the first microelectronic device and the third microelectronic device are in a face-down orientation for facing the upper surface of the substrate.

9. The vertically integrated microelectronic package according to claim 8, wherein the second microelectronic device and the third microelectronic device are respective passive microelectronic devices.

10. The vertically integrated microelectronic package according to claim 8, wherein the second microelectronic device and the third microelectronic device respectively are another passive microelectronic device and an active microelectronic device.

* * * * *